(12) United States Patent
Dyvorne et al.

(10) Patent No.: US 11,662,402 B2
(45) Date of Patent: *May 30, 2023

(54) RADIO-FREQUENCY COIL SIGNAL CHAIN FOR A LOW-FIELD MRI SYSTEM

(71) Applicant: Hyperfine Operations, Inc., Guilford, CT (US)

(72) Inventors: Hadrien A. Dyvorne, New York, NY (US); Todd Rearick, Cheshire, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 111 days.

This patent is subject to a terminal disclaimer.

(21) Appl. No.: 17/182,777

(22) Filed: Feb. 23, 2021

(65) Prior Publication Data

US 2021/0199739 A1   Jul. 1, 2021

Related U.S. Application Data

(63) Continuation of application No. 16/418,414, filed on May 21, 2019, now Pat. No. 10,969,446.
(Continued)

(51) Int. Cl.
*G01R 33/34* (2006.01)
*G01R 33/44* (2006.01)
(Continued)

(52) U.S. Cl.
CPC ..... *G01R 33/34007* (2013.01); *G01R 33/445* (2013.01); *G01R 33/0029* (2013.01);
(Continued)

(58) Field of Classification Search
CPC ............ G01R 33/34007; G01R 33/445; G01R 33/0029; G01R 33/3614; G01R 33/3628;
(Continued)

(56) References Cited

U.S. PATENT DOCUMENTS 4,712,068 A   12/1987   Savelainen
4,961,054 A   10/1990   Park et al.
(Continued)

FOREIGN PATENT DOCUMENTS

WO   WO 2004/061469 A1   7/2004
WO   WO 2006/030331 A2   3/2006
(Continued)

OTHER PUBLICATIONS

U.S. Appl. No. 16/418,379, filed May 21, 2019, Dyvorne et al.
(Continued)

*Primary Examiner* — Susan S Lee
(74) *Attorney, Agent, or Firm* — Wolf, Greenfield & Sacks, P.C.

(57) ABSTRACT

A radio-frequency (RF) coil for use in a low-field magnetic resonance imaging system and methods of making the same are provided. The RF coil may include a conductor arranged on a substrate in an arrangement such that symmetry in the arrangement cancels at least a portion of a common mode voltage when a current is passed through the conductor. The RF coil may be included in a magnetic resonance imaging (MRI) system for imaging a patient having at least one $B_0$ magnet for generating a $B_0$ magnetic field.

20 Claims, 32 Drawing Sheets

Related U.S. Application Data

(60) Provisional application No. 62/692,454, filed on Jun. 29, 2018, provisional application No. 62/674,458, filed on May 21, 2018.

(51) Int. Cl.
    *G01R 33/36*    (2006.01)
    *G01R 33/00*    (2006.01)
    *G01R 33/385*   (2006.01)
    *G01R 33/565*   (2006.01)

(52) U.S. Cl.
    CPC ...... *G01R 33/3614* (2013.01); *G01R 33/3628* (2013.01); *G01R 33/3854* (2013.01); *G01R 33/565* (2013.01)

(58) Field of Classification Search
    CPC .............. G01R 33/3854; G01R 33/565; G01R 33/34053; G01R 33/341; G01R 33/3657
    See application file for complete search history.

(56) References Cited

U.S. PATENT DOCUMENTS

| | | |
|---|---|---|
| 5,051,700 A | 9/1991 | Fox |
| 6,144,205 A | 11/2000 | Souza et al. |
| 6,498,489 B1 | 12/2002 | Vij |
| 6,798,207 B2 | 9/2004 | Viti |
| 7,466,128 B2 | 12/2008 | Walsh |
| 7,514,924 B2 | 4/2009 | Luedeke et al. |
| 7,986,143 B2 | 7/2011 | Walsh |
| 8,451,004 B2 | 5/2013 | Walsh |
| 9,541,616 B2 | 1/2017 | Rothberg et al. |
| 9,547,057 B2 | 1/2017 | Rearick et al. |
| 9,625,544 B2 | 4/2017 | Poole et al. |
| 9,645,210 B2 | 5/2017 | McNulty et al. |
| 9,817,093 B2 | 11/2017 | Rothberg et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,310,037 B2 | 6/2019 | McNulty et al. |
| 10,317,502 B2 | 6/2019 | Harvey et al. |
| 10,416,264 B2 | 9/2019 | Sofka et al. |
| 10,551,452 B2 | 2/2020 | Rearick et al. |
| 10,591,561 B2 | 3/2020 | Sacolick et al. |
| 10,709,387 B2 | 7/2020 | Poole et al. |
| 10,871,530 B2 | 12/2020 | Dyvorne et al. |
| 10,890,634 B2 | 1/2021 | Dyvorne et al. |
| 10,969,446 B2* | 4/2021 | Dyvorne .......... G01R 33/34007 |
| 2002/0013526 A1 | 1/2002 | Su et al. |
| 2007/0240298 A1* | 10/2007 | Terrovitis ............. H03H 7/1775 716/122 |
| 2009/0102484 A1 | 4/2009 | DeVries et al. |
| 2011/0012598 A1 | 1/2011 | van Helvoort et al. |
| 2011/0068792 A1 | 3/2011 | Iannotti et al. |
| 2012/0176135 A1 | 7/2012 | Iannotti et al. |
| 2014/0070808 A1 | 3/2014 | Reykowski et al. |
| 2014/0176135 A1 | 6/2014 | Griswold et al. |
| 2016/0128592 A1 | 5/2016 | Rosen et al. |
| 2016/0131727 A1 | 5/2016 | Sacolick et al. |
| 2016/0320465 A1 | 11/2016 | Huber et al. |
| 2017/0074956 A1 | 3/2017 | Rosen et al. |
| 2018/0081008 A1* | 3/2018 | Yang ..................... G01R 33/48 |
| 2019/0038233 A1 | 2/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0022611 A1 | 1/2020 | Nelson et al. |
| 2020/0022612 A1 | 1/2020 | McNulty et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0200844 A1 | 6/2020 | Boskamp et al. |
| 2020/0209334 A1 | 7/2020 | O'Halloran et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0355765 A1 | 11/2020 | Chen et al. |
| 2021/0080524 A1 | 3/2021 | Dyvorne et al. |
| 2021/0116520 A1 | 4/2021 | Dyvorne et al. |

FOREIGN PATENT DOCUMENTS

| | | |
|---|---|---|
| WO | WO 2007/001463 A2 | 1/2007 |
| WO | WO 2007/030832 A2 | 3/2007 |

OTHER PUBLICATIONS

U.S. Appl. No. 16/418,397, filed May 21, 2019, Dyvorne et al.
U.S. Appl. No. 16/418,414, filed May 21, 2019, Dyvorne et al.
U.S. Appl. No. 17/094,301, filed Nov. 10, 2020, Dyvorne et al.
U.S. Appl. No. 17/109,320, filed Dec. 2, 2020, Dyvorne et al.
PCT/US2019/033269, Aug. 5, 2019, Invitation to Pay Additional Fees.
PCT/US2019/033269, Oct. 2, 2019, International Search Report and Written Opinion.
International Search Report and Written Opinion for International Application No. PCT/US2019/033269 dated Oct. 2, 2019.
Invitation to Pay Additional Fees for International Application No. PCT/US2019/033269 dated Aug. 5, 2019.
Baudin et al., An active feedback scheme for low field NMR experiments. Journal of Physics: Conference Series, Institute of Physics Publishing. 2011;294(1). 8 pages.
Seton et al., Use of a DC Squid receiver preamplifier in a low field MRI system. IEEE Transactions on Applied Superconductivity. IEEE Service Center. 1995;5(2):3218-21.

* cited by examiner

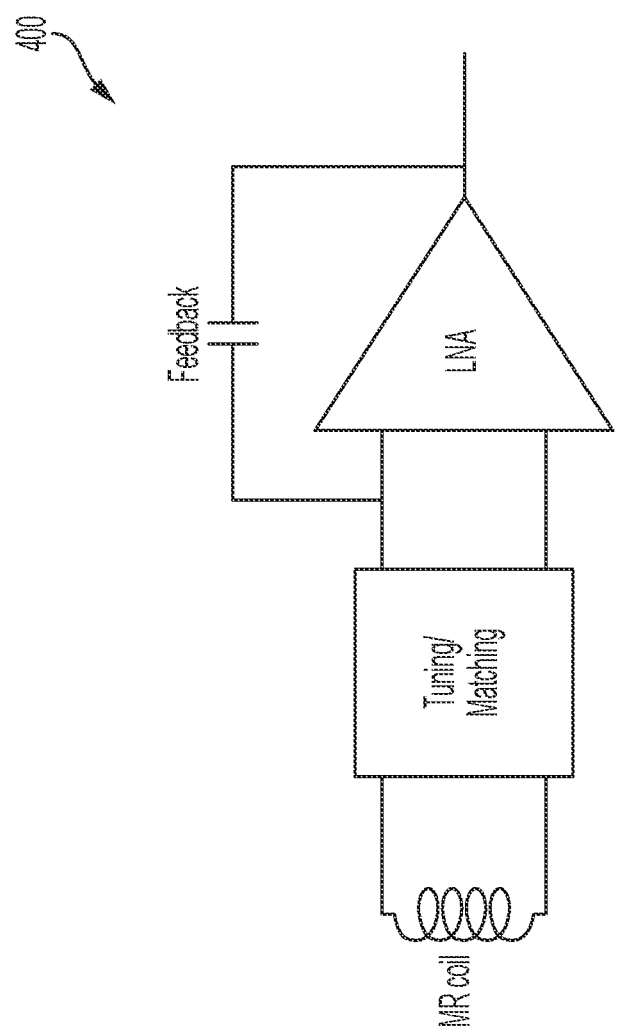

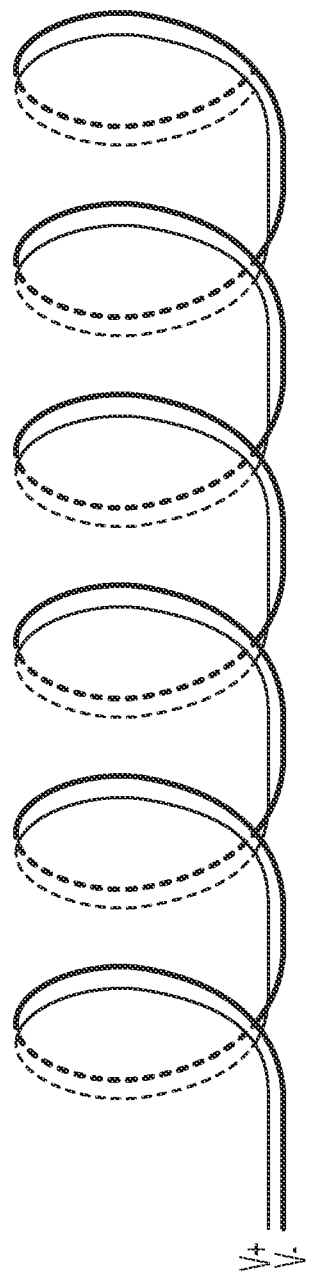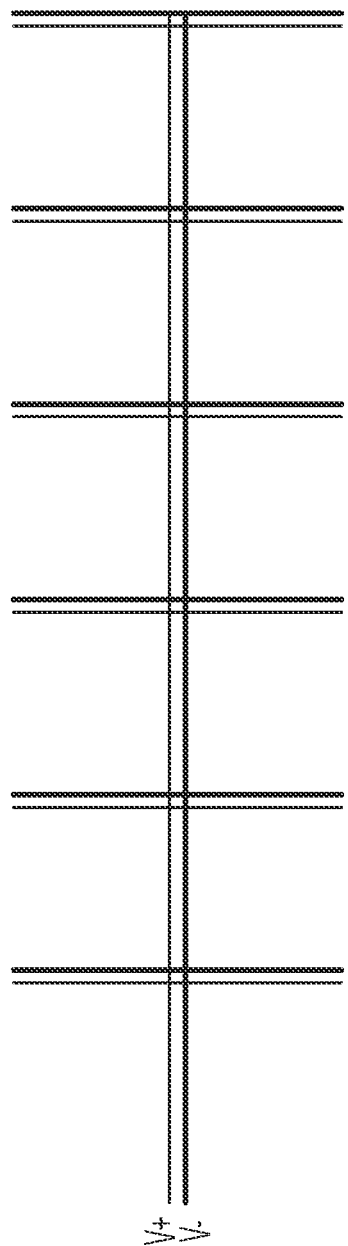

RADIO-FREQUENCY COIL SIGNAL CHAIN FOR A LOW-FIELD MRI SYSTEM

CROSS-REFERENCE TO RELATED APPLICATIONS

This application is a continuation of and claims priority under 35 U.S.C. § 120 to U.S. patent application Ser. No. 16/418,414, titled "RADIO-FREQUENCY COIL SIGNAL CHAIN FOR A LOW-FIELD MRI SYSTEM," filed May 21, 2019, which claims priority under 35 U.S.C. § 119(e) to U.S. Provisional Application No. 62/674,458, filed May 21, 2018, and titled, "Radio-frequency Coil Signal Chain for a Low-field MRI System," and U.S. Provisional Application No. 62/692,454, filed Jun. 29, 2018, and titled, "Radio-frequency Coil Signal Chain for a Low-field MRI System," the entire contents of each of which is incorporated by reference herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Some embodiments include a switching circuit configured to be coupled to a radio-frequency (RF) coil of a low-field magnetic resonance imaging system. The switching circuit comprises at least one field effect transistor (FET) configured to operate as an RF switch at an operating frequency of less than 10 MHz.

Some embodiments include a drive circuit configured to apply a gate voltage to at least one field-effect transistor (FET) configured to operate as a radio-frequency switch in a low-field magnetic resonance imaging system. The drive circuit comprises at least one isolation element configured to isolate a voltage source from the at least one FET.

Some embodiments include a circuit configured to tune a radio frequency (RF) coil coupled to an amplifier of a low-field magnetic resonance imaging system. The circuit comprises tuning circuitry coupled across inputs of the amplifier, and active feedback circuitry coupled between an output of the amplifier and an input of the amplifier.

Some embodiments include a circuit configured to tune a radio frequency (RF) coil coupled to an amplifier of a low-field magnetic resonance imaging system. The circuit comprises active feedback circuitry coupled between an output of the amplifier and an input of the amplifier to reduce a quality factor of the RF coil.

Some embodiments include a method of tuning a radio frequency (RF) coil coupled to an amplifier of a low-field magnetic resonance imaging system. The method comprises arranging tuning circuitry across first and second inputs of the amplifier, and coupling active feedback circuitry between an output of the amplifier and an input of the amplifier.

Some embodiments include a radio-frequency (RF) coil for use in a low-field magnetic resonance imaging system. The RF coil comprises a substrate having a first side and a second side, and a conductor including a first portion wound around the substrate from the first side to the second side at a first plurality of locations spaced between the first side and the second side and a second portion wound around the substrate from the second side to the first side at a second plurality of locations spaced between the first side and the second side, wherein the first plurality of locations alternate with the second plurality of locations spaced between the first side and the second side.

Some embodiments include a method of manufacturing a radio-frequency (RF) coil for use in a low-field magnetic resonance imaging system. The method comprises providing a substrate having circumferential grooves formed therein at a plurality of levels, each of which is arranged at a different distance from a first side of the substrate and connecting grooves that connect adjacent levels of the plurality levels, winding within a first part of the circumferential grooves and the connecting grooves, a first portion of a conductor from the first side of the substrate to a second side of the substrate, and winding within a second part of the circumferential grooves and the connecting grooves, a second portion of the conductor from the second side of the substrate to the first side of the substrate, wherein the first part of the circumferential grooves and the second part of the circumferential grooves do not overlap.

Some embodiments include a radio-frequency (RF) coil for use in a low-field magnetic resonance imaging system. The RF coil comprises a substrate having a first side and a second side, and a conductor wound around the substrate in a balanced winding pattern, wherein, in the balanced winding pattern, a first portion of the conductor wound around the substrate from the first side to the second side crosses over a second portion of the conductor wound around the substrate from the second side to the first side.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

Various aspects and embodiments of the disclosed technology will be described with reference to the following figures. It should be appreciated that the figures are not necessarily drawn to scale.

FIG. 5 illustrates decoupling circuitry using amplifier feedback in accordance with some embodiments;

FIG. 18A illustrates a double loop winding design for an RF coil in accordance with some embodiments;

FIG. 18B illustrates a top view of the double loop winding design of FIG. 18A;

DETAILED DESCRIPTION

Figure 1:
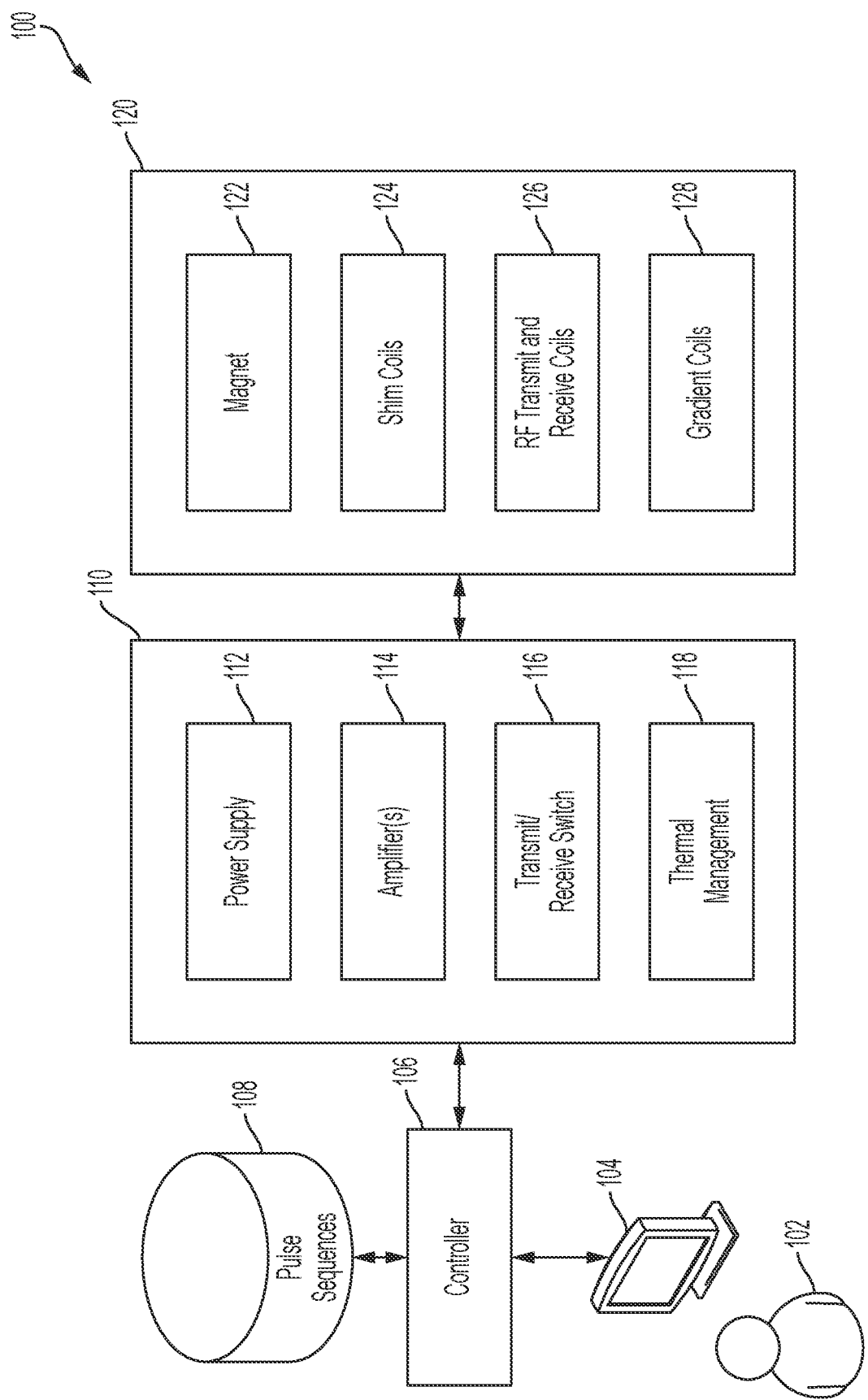
FIG. 1 illustrates exemplary components of a magnetic resonance imaging system.

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

As discussed above, conventional MRI systems require specialized facilities. An electromagnetically shielded room is required for the MRI system to operate and the floor of the room must be structurally reinforced. Additional rooms must be provided for the high-power electronics and the scan technician's control area. Secure access to the site must also be provided. In addition, a dedicated three-phase electrical connection must be installed to provide the power for the electronics that, in turn, are cooled by a chilled water supply. Additional HVAC capacity typically must also be provided. These site requirements are not only costly, but significantly limit the locations where MRI systems can be deployed. Conventional clinical MRI scanners also require substantial expertise to both operate and maintain. These highly trained technicians and service engineers add large on-going operational costs to operating an MRI system. Conventional MRI, as a result, is frequently cost prohibitive and is severely limited in accessibility, preventing MRI from being a widely available diagnostic tool capable of delivering a wide range of clinical imaging solutions wherever and whenever needed. Typically, a patient must visit one of a limited number of facilities at a time and place scheduled in advance, preventing MRI from being used in numerous medical applications for which it is uniquely efficacious in assisting with diagnosis, surgery, patient monitoring and the like.

As discussed above, high-field MRI systems require specially adapted facilities to accommodate the size, weight, power consumption and shielding requirements of these systems. For example, a 1.5 T MRI system typically weighs between 4-10 tons and a 3 T MRI system typically weighs between 8-20 tons. In addition, high-field MRI systems generally require significant amounts of heavy and expensive shielding. Many mid-field scanners are even heavier, weighing between 10-20 tons due, in part, to the use of very large permanent magnets and/or yokes. Commercially available low-field MRI systems (e.g., operating with a $B_0$ magnetic field of 0.2 T) are also typically in the range of 10 tons or more due the large of amounts of ferromagnetic material used to generate the $B_0$ field, with additional tonnage in shielding. To accommodate this heavy equipment, rooms (which typically have a minimum size of 30-50 square meters) have to be built with reinforced flooring (e.g., concrete flooring), and must be specially shielded to prevent electromagnetic radiation from interfering with operation of the MRI system. Thus, available clinical MRI systems are immobile and require the significant expense of a large, dedicated space within a hospital or facility, and in addition to the considerable costs of preparing the space for operation, require further additional on-going costs in expertise in operating and maintaining the system.

In addition, currently available MRI systems typically consume large amounts of power. For example, common 1.5 T and 3 T MRI systems typically consume between 20-40 kW of power during operation, while available 0.5 T and 0.2 T MRI systems commonly consume between 5-20 kW, each using dedicated and specialized power sources. Unless otherwise specified, power consumption is referenced as average power consumed over an interval of interest. For example, the 20-40 kW referred to above indicates the average power consumed by conventional MRI systems during the course of image acquisition, which may include relatively short periods of peak power consumption that significantly exceeds the average power consumption (e.g., when the gradient coils and/or RF coils are pulsed over relatively short periods of the pulse sequence). Intervals of peak (or large) power consumption are typically addressed via power storage elements (e.g., capacitors) of the MRI system itself. Thus, the average power consumption is the more relevant number as it generally determines the type of power connection needed to operate the device. As discussed above, available clinical MRI systems must have dedicated power sources, typically requiring a dedicated three-phase connection to the grid to power the components of the MRI system. Additional electronics are then needed to convert the three-phase power into single-phase power utilized by the MRI system. The many physical requirements of deploying conventional clinical MRI systems creates a significant problem of availability and severely restricts the clinical applications for which MRI can be utilized.

Accordingly, the many requirements of high-field MRI render installations prohibitive in many situations, limiting their deployment to large institutional hospitals or specialized facilities and generally restricting their use to tightly scheduled appointments, requiring the patient to visit dedicated facilities at times scheduled in advance. Thus, the many restrictions on high field MRI prevent MRI from being fully utilized as an imaging modality. Despite the drawbacks of high-field MRI mentioned above, the appeal of the significant increase in SNR at higher fields continues to drive the industry to higher and higher field strengths for use in clinical and medical MRI applications, further increasing the cost and complexity of MRI scanners, and further limiting their availability and preventing their use as a general-purpose and/or generally-available imaging solution.

The low SNR of MR signals produced in the low-field regime (particularly in the very low-field regime) has prevented the development of a relatively low cost, low power and/or portable MRI system. Conventional "low-field" MRI systems operate at the high end of what is typically characterized as the low-field range (e.g., clinically available low-field systems have a floor of approximately 0.2 T) to achieve useful images. Though somewhat less expensive then high-field MRI systems, conventional low-field MRI systems share many of the same drawbacks. In particular, conventional low-field MRI systems are large, fixed and immobile installments, consume substantial power (requiring dedicated three-phase power hook-ups) and require specially shielded rooms and large dedicated spaces. The challenges of low-field MRI have prevented the development of relatively low cost, low power and/or portable MRI systems that can produce useful images.

The inventors have developed techniques enabling portable, low-field, low power and/or lower-cost MRI systems that can improve the wide-scale deployability of MRI technology in a variety of environments beyond the current MRI installments at hospitals and research facilities. As a result, MRI can be deployed in emergency rooms, small clinics, doctor's offices, in mobile units, in the field, etc. and may be brought to the patient (e.g., bedside) to perform a wide variety of imaging procedures and protocols. Some embodiments include very low-field MRI systems (e.g., 0.1 T, 50 mT, 20 mT, etc.) that facilitate portable, low-cost, low-power MRI, significantly increasing the availability of MRI in a clinical setting.

There are numerous challenges to developing a clinical MRI system in the low-field regime. As used herein, the term clinical MRI system refers to an MRI system that produces clinically useful images, which refers to images having sufficient resolution and adequate acquisition times to be useful to a physician or clinician for its intended purpose given a particular imaging application. As such, the resolutions/acquisition times of clinically useful images will depend on the purpose for which the images are being obtained. Among the numerous challenges in obtaining clinically useful images in the low-field regime is the relatively low SNR. Specifically, the relationship between SNR and $B_0$ field strength is approximately $B_0^{5/4}$ at field strength above 0.2 T and approximately $B_0^{3/2}$ at field strengths below 0.1 T. As such, the SNR drops substantially with decreases in field strength with even more significant drops in SNR experienced at very low field strength. This substantial drop in SNR resulting from reducing the field strength is a significant factor that has prevented development of clinical MRI systems in the very low-field regime. In particular, the challenge of the low SNR at very low field strengths has prevented the development of a clinical MRI system operating in the very low-field regime. As a result, clinical MRI systems that seek to operate at lower field strengths have conventionally achieved field strengths of approximately the 0.2 T range and above. These MRI systems are still large, heavy and costly, generally requiring fixed dedicated spaces (or shielded tents) and dedicated power sources.

The inventors have developed low-field and very low-field MRI systems capable of producing clinically useful images, allowing for the development of portable, low cost and easy to use MRI systems not achievable using state of the art technology. According to some embodiments, an MRI system can be transported to the patient to provide a wide variety of diagnostic, surgical, monitoring and/or therapeutic procedures, generally, whenever and wherever needed.

FIG. 1 is a block diagram of typical components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that a MRI system may have one or more other components of any suitable type in addition to or instead of the components illustrated in FIG. 1. However, a MRI system will generally include these high level components, though the implementation of these components for a particular MRI system may differ vastly, as discussed in further detail below.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field. As discussed above, in the high field regime, the $B_0$ magnet is typically formed using superconducting material generally provided in a solenoid geometry, requiring cryogenic cooling systems to keep the $B_0$ magnet in a superconducting state. Thus, high-field $B_0$ magnets are expensive, complicated and consume large amounts of power (e.g., cryogenic cooling systems require significant power to maintain the extremely low temperatures needed to keep the $B_0$ magnet in a superconducting state), require large dedicated spaces, and specialized, dedicated power connections (e.g., a dedicated three-phase power connection to the power grid). Conventional low-field $B_0$ magnets (e.g., $B_0$ magnets operating at 0.2 T) are also often implemented using superconducting material and therefore have these same general requirements. Other conventional low-field $B_0$ magnets are implemented using permanent magnets, which to produce the field strengths to which conventional low-field systems are limited (e.g., between 0.2 T and 0.3 T due to the inability to acquire useful images at lower field strengths), need to be very large magnets weighing 5-20 tons. Thus, the $B_0$ magnet of conventional MRI systems alone prevents both portability and affordability.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications. As discussed above, conventional gradient coils also consume significant power, typically operated by large, expensive gradient power sources, as discussed in further detail below.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses.

Power management system 110 includes electronics to provide operating power to one or more components of the low-field MRI system 100. For example, as discussed in more detail below, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

In conventional MRI systems, the power components are large, expensive and consume significant power. Typically, the power electronics occupy a room separate from the MRI scanner itself. The power electronics not only require substantial space, but are expensive complex devices that consume substantial power and require wall mounted racks to be supported. Thus, the power electronics of conventional MRI systems also prevent portability and affordable of MRI.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information. In conventional MRI systems, computing device 104 typically includes one or more high performance work-stations configured to perform computationally expensive processing on MR data relatively rapidly. Such computing devices are relatively expensive equipment on their own.

As should be appreciated from the foregoing, currently available clinical MRI systems (including high-field, mid-field and low-field systems) are large, expensive, fixed installations requiring substantial dedicated and specially designed spaces, as well as dedicated power connections. The inventors have developed low-field, including very-low field, MRI systems that are lower cost, lower power and/or portable, significantly increasing the availability and applicability of MRI. According to some embodiments, a portable MRI system is provided, allowing an MRI system to be brought to the patient and utilized at locations where it is needed.

As discussed above, some embodiments include an MRI system that is portable, allowing the MRI device to be moved to locations in which it is needed (e.g., emergency and operating rooms, primary care offices, neonatal intensive care units, specialty departments, emergency and mobile transport vehicles and in the field). There are numerous challenges that face the development of a portable MRI system, including size, weight, power consumption and the ability to operate in relatively uncontrolled electromagnetic noise environments (e.g., outside a specially shielded room.

An aspect of portability involves the capability of operating the MRI system in a wide variety of locations and environments. As discussed above, currently available clinical MRI scanners are required to be located in specially shielded rooms to allow for correct operation of the device and is one (among many) of the reasons contributing to the cost, lack of availability and non-portability of currently available clinical MRI scanners. Thus, to operate outside of a specially shielded room and, more particularly, to allow for generally portable, cartable or otherwise transportable MRI, the MRI system must be capable of operation in a variety of noise environments. The inventors have developed noise suppression techniques that allow the MRI system to be operated outside of specially shielded rooms, facilitating both portable/transportable MRI as well as fixed MRI installments that do not require specially shielded rooms. While the noise suppression techniques allow for operation outside specially shielded rooms, these techniques can also be used to perform noise suppression in shielded environments, for example, less expensive, loosely or ad-hoc shielding environments, and can be therefore used in conjunction with an area that has been fitted with limited shielding, as the aspects are not limited in this respect.

A further aspect of portability involves the power consumption of the MRI system. As also discussed above, current clinical MRI systems consume large amounts of power (e.g., ranging from 20 kW to 40 kW average power consumption during operation), thus requiring dedicated power connections (e.g., dedicated three-phase power connections to the grid capable of delivering the required power). The requirement of a dedicated power connection is a further obstacle to operating an MRI system in a variety of locations other than expensive dedicated rooms specially fitted with the appropriate power connections. The inventors have developed low power MRI systems capable of operating using mains electricity such as a standard wall outlet (e.g., 120V/20 A connection in the U.S.) or common large appliance outlets (e.g., 220-240V/30 A), allowing the device to be operated anywhere common power outlets are provided. The ability to "plug into the wall" facilitates both portable/transportable MRI as well as fixed MRI system installations without requiring special, dedicated power such as a three-phase power connection.

As discussed above, a portable MRI device designed in accordance with the techniques described herein includes RF transmit and receive coils 126 configured to generate a $B_1$ magnetic field during a transmit operation and to collect flux from an MR signal generated by an imaged object during a receive operation. Signals sensed by the RF receive coil are amplified and processed prior to conversion into MR images. Circuitry involved in the control and processing of signals recorded by the RF receive coils 126 are referred to herein as "RF signal chain" circuitry. The inventors have recognized that components of the RF signal chain circuitry used in conventional high-field MRI system are not appropriate and/or optimized for use in a low-field MRI system designed in accordance with the techniques described herein. To this end, some embodiments are directed to improved RF signal chain circuitry for use in a portable low-field MRI system.

Figure 2:
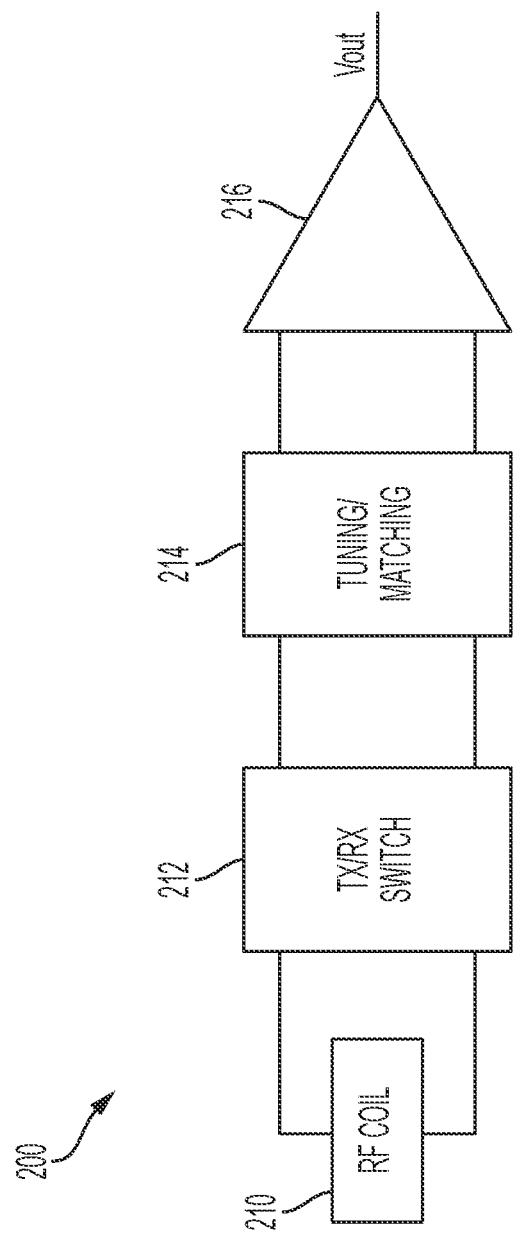
FIG. 2 illustrates components of an RF signal chain for a magnetic resonance imaging system.

FIG. 2 schematically illustrates some components of RF signal chain circuitry 200 included in some embodiments. RF signal chain circuitry 200 includes RF transmit/receive coil 210 and transmit/receive circuitry 212 configured to selectively couple the RF coil 210 to the RF receive circuitry depending on whether the RF coil 210 is being operated to transmit or receive. To operate optimally, RF coils are often tuned to resonate as close as possible to a particular frequency called the Larmor frequency. The Larmor frequency (ω) is related to the strength of the $B_0$ field in accordance with following relation: $\omega = \gamma \beta$, where $\gamma$ is the gyromagnetic ratio of the imaged isotope (e.g., 1H) in MHz/T, and B is the strength of the $B_0$ field in Tesla. Examples of commonly used Larmor frequencies used in high-field MRI are approximately 64 MHz for a 1.5 T MRI system and approximately 128 MHz for a 3 T MRI system. For low-field MRI systems, the Larmor frequency is substantially lower than for high-field MRI systems. For example, the Larmor frequency for a 64 mT MRI system is approximately 2.75 MHz. RF signal chain circuitry 200 further includes tuning/matching circuitry 214 configured to transform the impedance of RF coil 210 to optimize performance. The output of tuning/matching circuitry 214 is provided to amplifier 216 (e.g., a low noise amplifier), which amplifies the RF signals prior to conversion into image signals. The inventors have recognized one of the difficulties with using RF coils in low-field MRI systems is the susceptibility of such coils to noise in electronic components. In accordance with some embodiments, one or more of components 210, 214, and 216 are configured to reduce noise in the RF signal chain.

Some embodiments include multiple RF coils to improve the signal-to-noise ratio (SNR) of signals detected by an RF coil network. For example, a collection of RF coils may be arranged at different locations and orientations to detect a comprehensive RF field. According to some embodiments, a portable MRI system comprises multiple RF transmit/receive coils to improve the SNR of image acquisition. For example, a portable MRI system may comprise 2, 4, 8, 16, 32 or more RF receive coils to improve the SNR of MR signal detection.

As discussed above, in general, RF coils are tuned to increase coil sensitivity at a frequency of interest (e.g., the Larmor frequency). However, inductive coupling between adjacent or neighboring coils (e.g., RF coils sufficiently proximate one another) degrades the sensitivity of tuned coils and significantly reduces the effectiveness of the collection of the RF coils. Techniques for geometrically decoupling neighboring coils exist but place strict constraints on coil orientation and position in space, reducing the ability of the collection of RF coils to accurately detect the RF field and, as a consequence, degrading the signal-to-noise performance.

Figure 3:
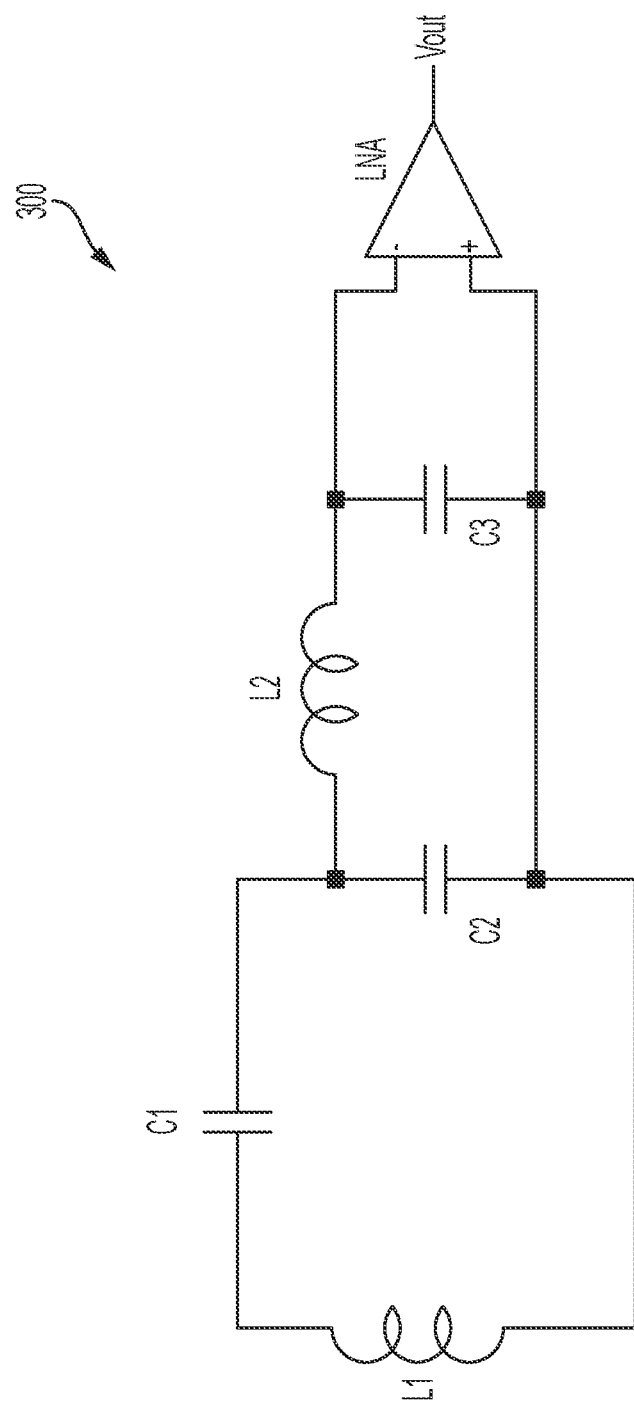
FIG. 3 illustrates decoupling circuitry for use within an RF signal chain of a magnetic resonance imaging system.
Figure 4A:
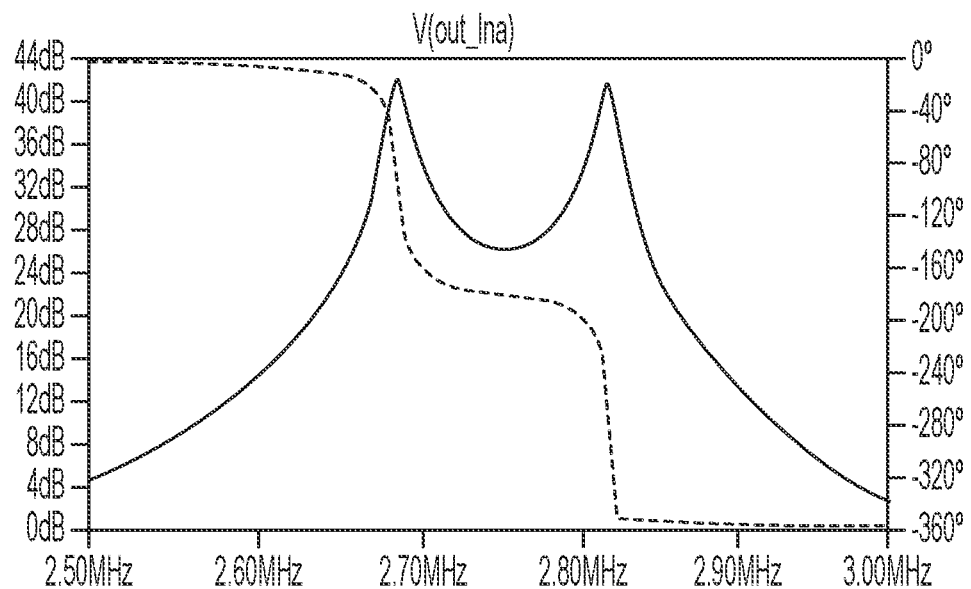
FIGS. 4A and 4B show simulation data associated with the decoupling circuitry of FIG. 3.
Figure 4B:
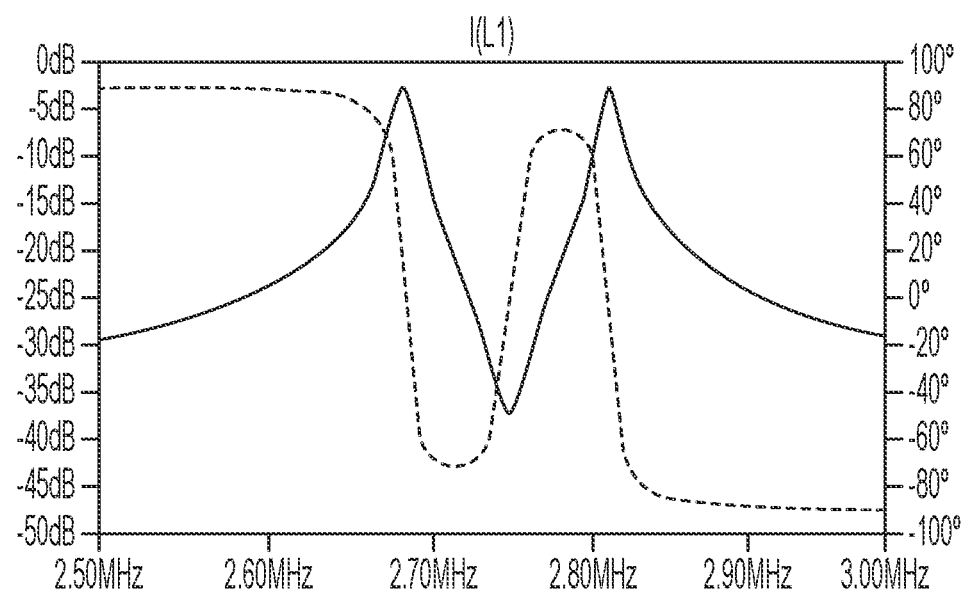

To address the negative impact of inductive coupling between coils, the inventors have utilized coil decoupling techniques that reduce the effect of inductive coupling between radio frequency coils in multi-coil transmit/receive systems. For example, FIG. 3 illustrates a passive decoupling circuit 300 configured to reduce inductive coupling between radio frequency coils in a multi-coil transmit/receive system. Circuit 300 is configured to decouple RF coils that may be subjected to $B_1$ transmit fields (e.g., from an RF transmit coil). The purpose of the decoupling circuit is to minimize the current through the RF coil for a given AC excitation voltage at the Larmor frequency. In particular, inductor L1 represents an RF signal coil within the field of view of the MRI system. Capacitors C1 and C2 form a tuning circuit that matches the inductance of the coil to the input of the low noise amplifier (LNA) to optimize noise performance impedance. Inductor L2 and capacitor C3 form a tank circuit that reduces the current that flows in in the loop that includes L1, C1 and C2 to prevent coupling of the RF coil to other coils. FIG. 4A illustrates a plot of the voltage at the LNA input at the resonant frequency of the RF coil based on a simulation of circuit 300 in FIG. 3. FIG. 4B illustrates a plot of current through the RF coil based on a simulation of circuit 300 in FIG. 3. As shown, at the resonant frequency of 2.75 MHz, the LNA voltage is about 26 dB (FIG. 4A) and the coil current is −37 dB (FIG. 4B). In each of FIGS. 4A and 4B, magnitude of the measured quantity is represented as a solid line and phase of the measured quantity is represented as a dashed line.

The inventors have recognized that decoupling using a tuned matching filter to reduce the current in the RF coil has some drawbacks including the need to tune multiple components (e.g., capacitors C1, C2 and C3) to the operating frequency of the coil. Additionally, losses in the inductor L2 result in a loss of SNR. As such, decoupling efficiency is a trade off with SNR efficiency. Furthermore, as shown in FIG. 4B, although the tuned matching filter reduces the coil current substantially at the resonant frequency, the sharp valley in the current waveform demonstrates that the current reduction through the RF coil is only small for a limited bandwidth surrounding the resonant frequency.

Some embodiments are directed to an improved decoupling circuit configured to reduce the current in the RF coil by damping the coil response using feedback from the output of the amplifier. FIG. 5 shows an example of a decoupling circuit 400 configured to provide feedback decoupling in accordance with some embodiments. Circuit 400 includes an active feedback path from the output of an amplifier LNA to an input of the LNA. In the example shown in FIG. 5, the active feedback path includes a single feedback path. However, it should be appreciated that the active feedback path may alternatively be implemented as a plurality of feedback paths, each which provides a different type of feedback decoupling when selected. For example, in some embodiments, the active feedback path includes a first feedback path configured to provide a first feedback signal and a second feedback path configured to provide a second feedback signal.

The inventors have recognized that the phase of the feedback signal affects the amplification gain at the tuning frequency. For example, in some embodiments that include multiple feedback paths in the active feedback path, a first feedback path may provide a first feedback signal 90 or 270 degrees out of phase with a resonant frequency of the RF coil and a second feedback path may provide a second feedback signal 180 degrees out of phase with a resonant frequency of the RF coil. Alternatively, the gain of the amplifier may be tuned to be 90 or 270 degrees out of phase with the resonant frequency of the coil. When a phase of 270 degrees is used, the amplification gain at the tuning frequency may be maximum. In other embodiments in which a single feedback path is used, the phase of the feedback signal may be set to 180 degrees to provide more efficient decoupling due to less current in the coil.

The feedback decoupling provided by circuit 400 uses active negative feedback to damp the coil response (also referred to as reducing the quality (Q) factor of the coil or "de-Qing" the coil) and thereby reducing current flowing in the RF coil. As shown, circuit 400 also includes a tuning/matching circuit arranged between the RF coil and the LNA. Any suitable tuning/matching circuit may be used in accordance with some embodiments, examples of which are described below.

Figure 6:
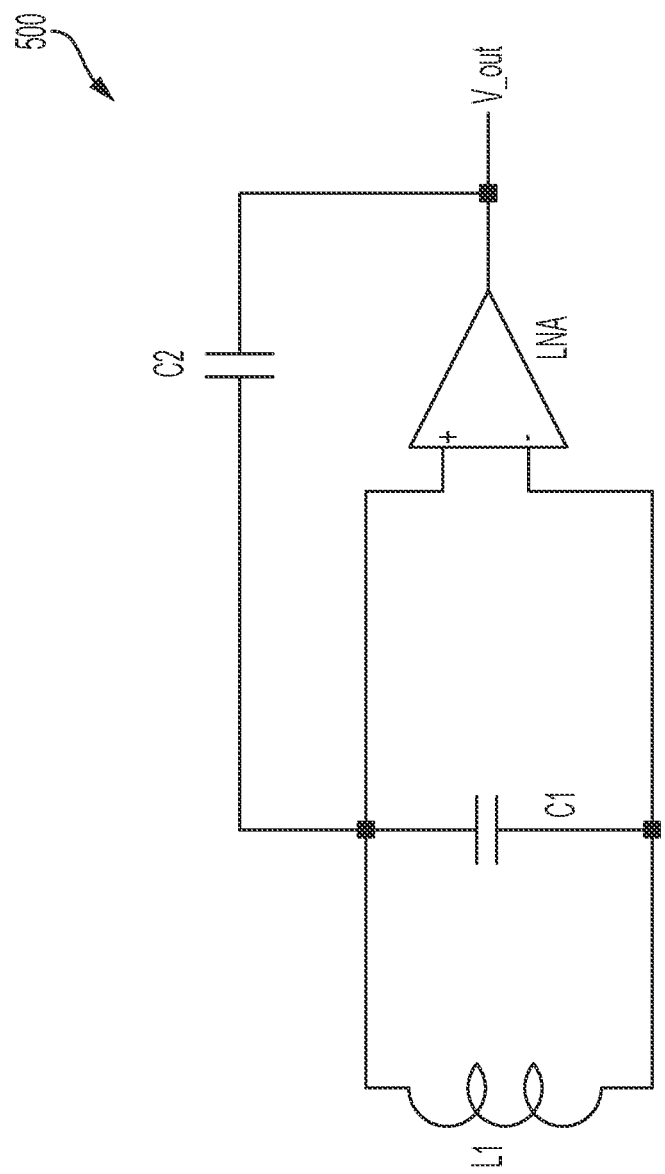
FIG. 6 illustrates the decoupling circuitry of FIG. 5 in which a single capacitor is used to provide coil tuning in accordance with some embodiments.

FIG. 6 illustrates a feedback-based decoupling circuit 500 that implements the tuning/matching circuit using a single capacitor C1. In contrast to decoupling circuit 300, decoupling circuit 500 includes only a single component (i.e., capacitor C1) to tune. Additionally, because circuit 500 only includes reactive components C1 and C2 and does not include an inductor in the tuning/matching circuit, the decoupling circuit does not introduce the SNR losses associated with circuit 300 due to the inclusion of inductor L1 in circuit 300.

Capacitor C1 may be implemented using a capacitor with a fixed value. Alternatively, capacitor C1 may be implemented using a capacitor with a variable value (e.g., a varactor diode). In yet further embodiments, capacitor C1 may be implemented using a capacitor with fixed value (e.g., 300 pF) arranged in parallel with a capacitor with variable value. Such an arrangement reduces the effect of AC losses introduced by use of a variable capacitor in the feedback loop.

Figure 7A:
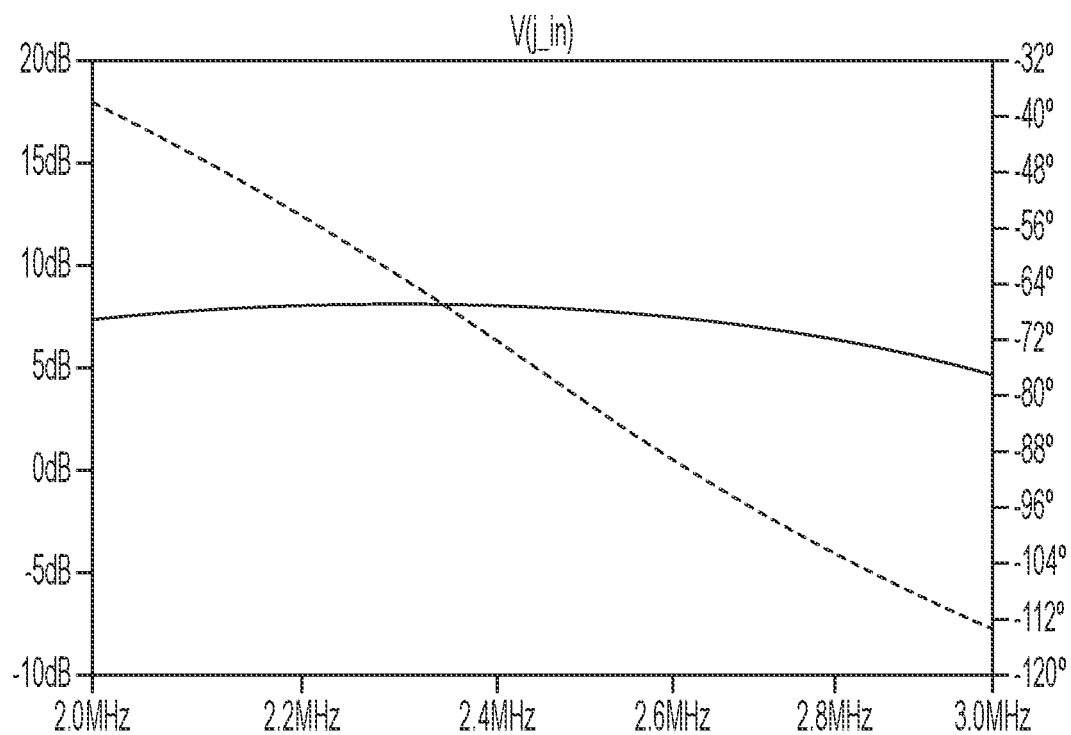
FIGS. 7A and 7B show simulation data associated with the decoupling circuitry of FIG. 6.
Figure 7B:
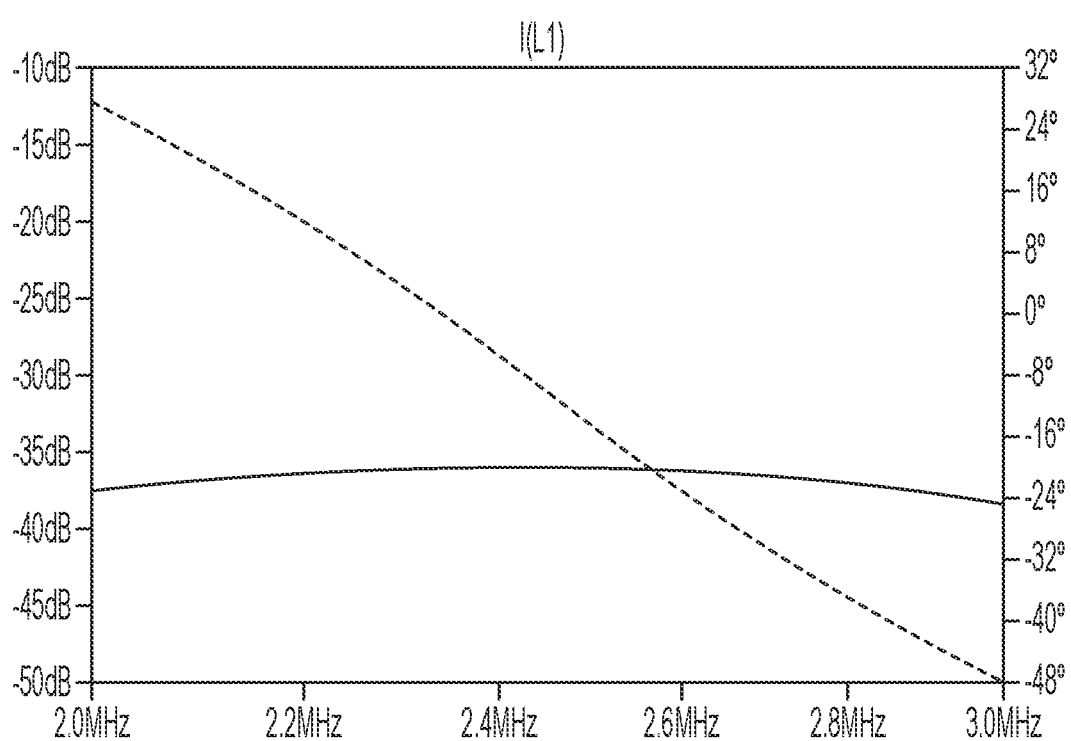

FIG. 7A illustrates a plot of the voltage at the LNA input at the resonant frequency of the RF coil based on a simulation of circuit 500 in FIG. 5. FIG. 7B illustrates a plot of current through the RF coil based on a simulation of circuit 500 in FIG. 6. As shown, at the resonant frequency of 2.75 MHz, the LNA input voltage is about 8 dB (FIG. 7B) and the current through the coil is about −35 dB. However, in contrast to the coil current plot shown in FIG. 4B which shows a sharp valley at the resonant frequency of the coil, FIG. 7B shows that the coil current is reduced over a much wider bandwidth when using decoupling circuit 500 as compared to circuit 300. Accordingly, in comparison to circuit 300, circuit 500 provides RF coil decoupling over a wider bandwidth.

Figure 8:
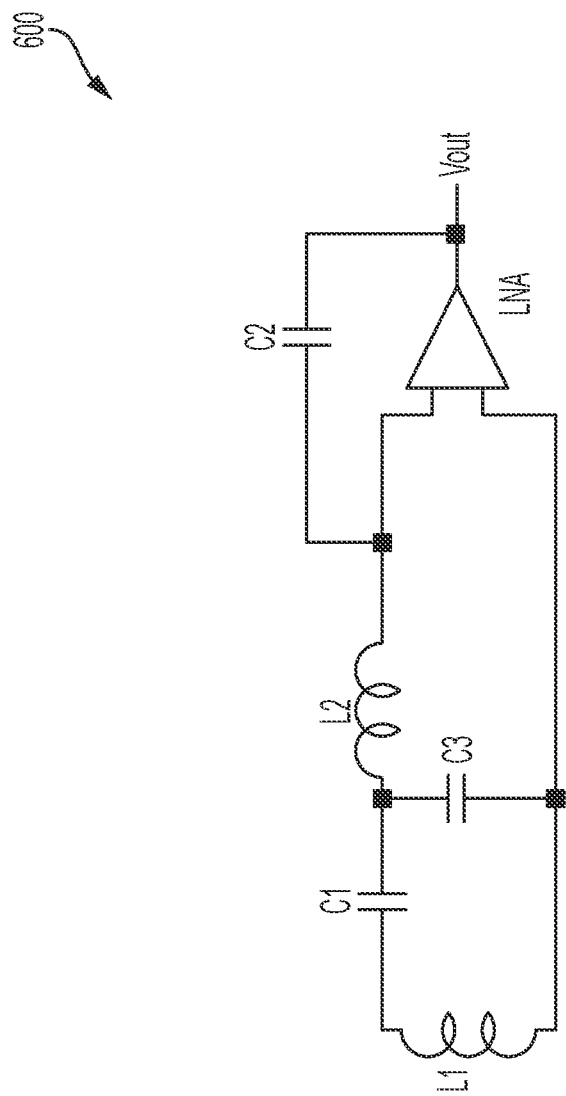
FIG. 8 illustrates the decoupling circuitry of FIG. 5 in which a tuning/matching network is used to provide coil tuning in accordance with some embodiments.

FIG. 8 illustrates an alternative feedback-based decoupling circuit 600 in which the single capacitor tuning/matching circuit of circuit 500 shown in FIG. 6 is replaced with a tuning/matching network that includes components C1, C3 and L2. In circuit 600, a tuning/matching network is used to tune the RF coil (represented as L1) in addition to having feedback-based decoupling provided by an active feedback path including capacitor C2.

Figure 24:
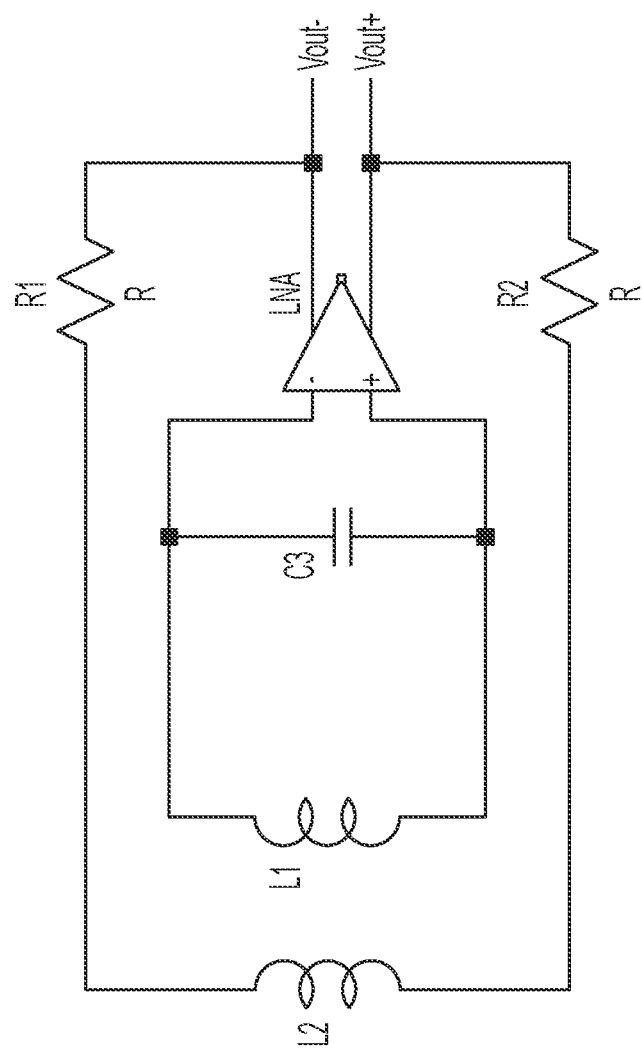
FIG. 24 illustrates decoupling circuitry using mutual inductive feedback in accordance with some embodiments.

In some embodiments, the capacitive feedback circuitry provided, for example, by the feedback components of circuits 400, 500, and 600 in FIGS. 5, 6 and 8, respectively, is replaced with mutual inductive feedback circuitry. FIG. 24 illustrates an alternative feedback-based decoupling circuit 2400 in which the capacitive feedback circuitry shown, for example, in circuit 500 of FIG. 6 is replaced with mutual inductive feedback circuitry that includes components R1, R2 and L2. In circuit 2400, inductors L1 and L2 are coupled mutually, e.g., using a transformer or through the air.

Figure 9:
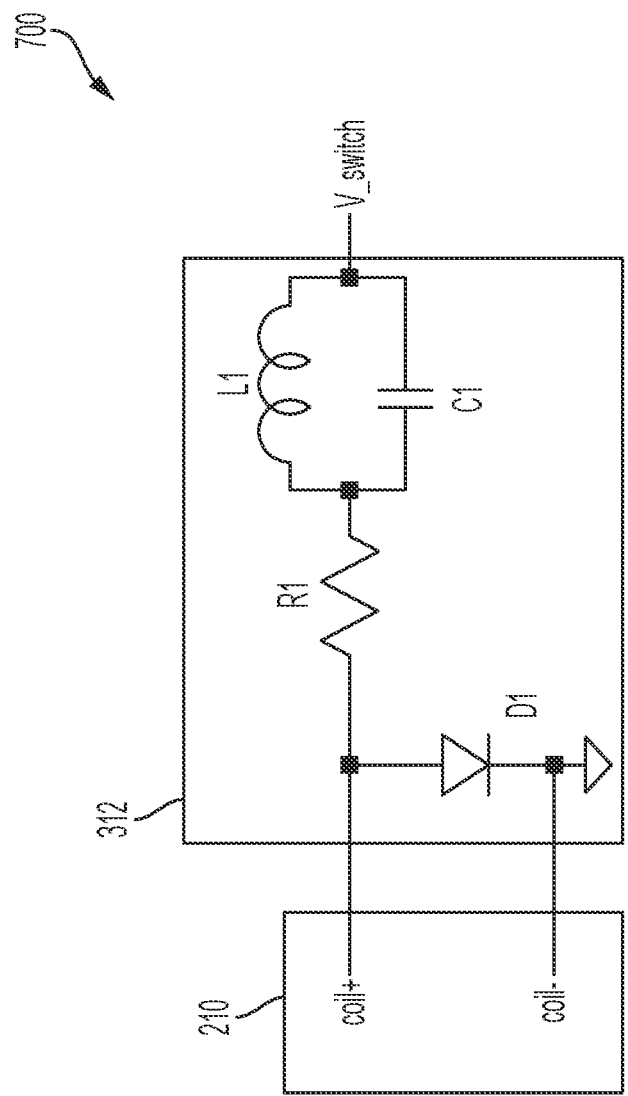
FIG. 9 illustrates circuitry for a diode-based switch for use in an RF signal chain of a magnetic resonance imaging system.

Another technique for providing RF coil decoupling in accordance with some embodiments it to provide a transmit/receive switch in the RF signal chain. The transmit/receive switch is configured to isolate the RF coil from the amplifier when RF signals are being transmitted by one or more RF transmit coils. Specifically, the transmit/receive switch divides the tuning/matching network into two network portions to protect sensitive electronics during RF transmit cycles. In some conventional MRI systems (e.g., high-field MRI systems), the transmit/receive switch 312 is typically implemented using a diode, such as a PIN diode. An example of transmit/receive switch circuitry that includes a diode D1 is shown in FIG. 9 as circuit 700. During a transmit pulse, diode D1 is turned on to create a short circuit, isolating the RF signal coil from the receive electronics. As described above in connection with circuit 300, the resulting network provides a tank circuit with a high impedance that ensures that the current in the RF coil remains small. During receive cycles, diode D1 is turned off resulting in the RF coil being connected to the amplifier and being tuned by the tank circuit configured to limit the current through the RF coil, while allowing for sufficient signal to be detected at the output of the amplifier. Thus, the RF coil is connected to a first tank circuit during transmit cycles and a second tank circuit during receive cycles of a pulse sequence.

Conventional decoupling circuits, such as that shown in FIG. 9, often use PIN diodes to isolate the receive electronics from the RF signal coil. However, PIN diodes suitable for performing this function in a decoupling circuit require approximately 0.1 A of current to turn the diode on. As an example, a transmit/receive coil system having eight receive coils may require on the order of 0.8 A of current to decouple the receive coils from the RF signal coil(s) for each transmit and receive cycle of an image acquisition pulse sequence. Accordingly, over the span of an image acquisition protocol, substantial power is consumed by the decoupling circuits of the RF transmit/receive system. Additionally, when PIN diodes are used, a biasing resistor R1 and an AC blocking filter including components L1 and C1 are required, and the ground of the circuit is not isolated when the diode is in the off state. Furthermore, while PIN diodes work well at higher frequencies used in high-field MRI systems, PIN diodes do not work well at low operating frequencies (e.g., less than 10 MHz) used in low field or very low field MRI systems. At such low frequencies, the PIN diode rectifies the signal rather than blocking it. For example, a DC bias current $I_{bias}$ allows the diode to be forward biased even when a negative signal is applied. For an AC signal of frequency f and peak current $I_{peak}$, the ratio $I_{peak}/f$ needs to be lower than the product of the DC bias current $I_{bias}$ and the carrier lifetime t in accordance with the following relation: $\tau I_{bias} > I_{peak}/f$ for the PIN diode to function properly to block the signal. However, some low-field MRI applications may have the following parameters, $I_{peak}=10$ A, f-2.75 MHz, $I_{bias}=100$ mA. According to the relation above, for these parameters, the PIN diode would need to have a carrier lifetime $\tau > 37$ s, which is not a characteristics of commercially-available PIN diodes.

The inventors have recognized that PIN diodes typically used in a decoupling circuit may be replaced by Gallium Nitride (GaN) field effect transistors (FETs) to address some of the shortcomings of using PIN diodes in an RF transmit/receive circuit of a low-field MRI system including reducing the power consumption of the RF transmit/receive system. In particular, GaN FETs require on the order of microamps to turn on, reducing the power consumption by several orders of magnitude. In addition, the resistance of the GaN FETs when turned on is small compared to PIN diodes, reducing negative impact on the tank circuit. According to some embodiments, diode D1 in circuit 700 is replaced with one or more GaN FETs, thereby reducing the power consumption of the RF transmit/receive system.

Figure 10:
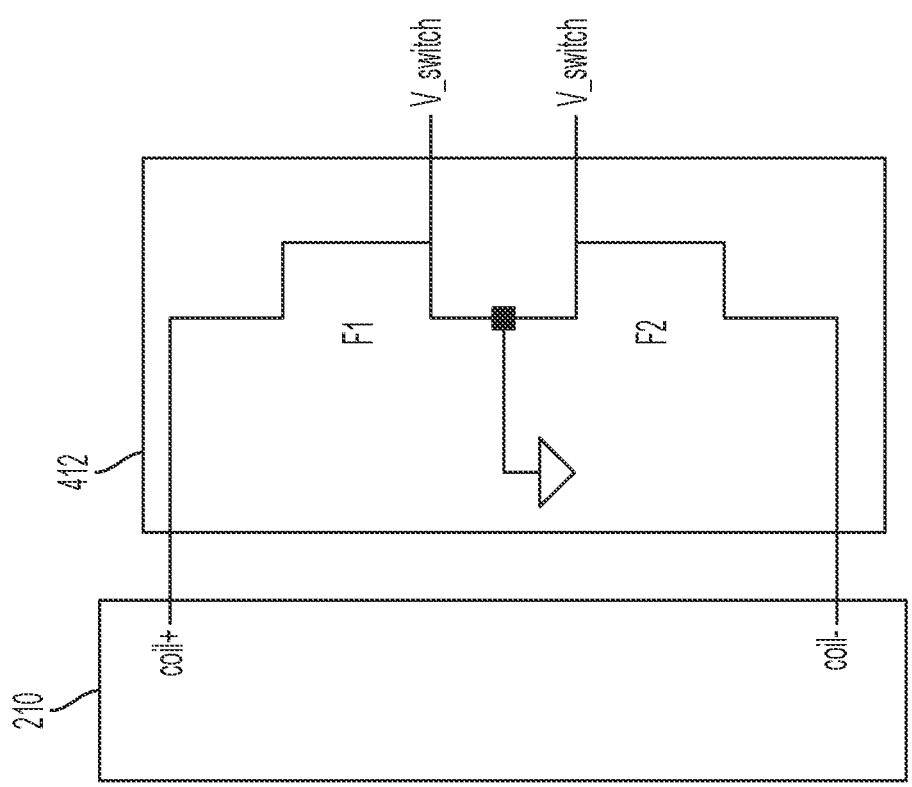
FIG. 10 illustrates circuitry for a FET-based switch for use in an RF signal chain of a magnetic resonance imaging system in accordance with some embodiments.

FIG. 10 illustrates a RF transmit/receive switch circuit 412 in accordance with some embodiments, in which the diode D1 of circuit 700 has been replaced with a pair of mirrored FETs (e.g., GaN FETs), F1 and F2. Although circuit 412 includes a pair of mirrored FETs, in some embodiments, an RF transmit/receive switch circuit 412 may include any suitable number of FETs including, but not limited to, a single FET. Unlike PIN diodes, GaN FETs operate well at all frequencies, have negligible power consumption, are ground isolated in the off-state, and have a lower on-state resistance (e.g., <0.1 Ohm) than PIN diodes.

Figure 11C:
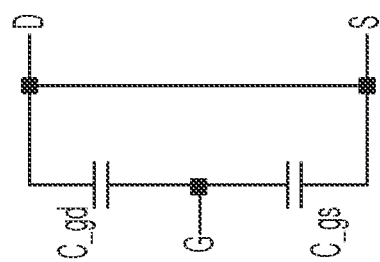
FIGS. 11A-C illustrate operating conditions of a FET in the FET-based switch of FIG. 10.
Figure 11B:
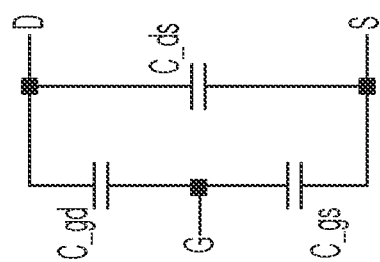
Figure 11A:
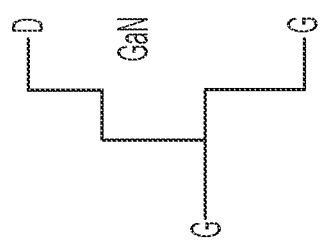

FIGS. 11A-C illustrate operating states of a FET used as a switch in an RF transmit/receive system in accordance with some embodiments. FIG. 11A illustrates a GaN FET configured as a switch between a drain node D and a source node S. The gate G of the GaN FET is used to control the state of the switch between on and off. FIG. 11B illustrates that in the off state, the GaN FET can be modeled with three lumped capacitors C_ds, C_gs, and C_gd. In such a configuration, the drain D is isolated from the source S provided that the value of C_ds is small (e.g., 10-100 pF). In some embodiments, the drain-source capacitance of at least one GaN FET included in a transmit/receive switch is at least 15 pF. FIG. 11C illustrates that in the on state, the drain-source capacitance C_ds is replaced by a short circuit.

Figure 12:
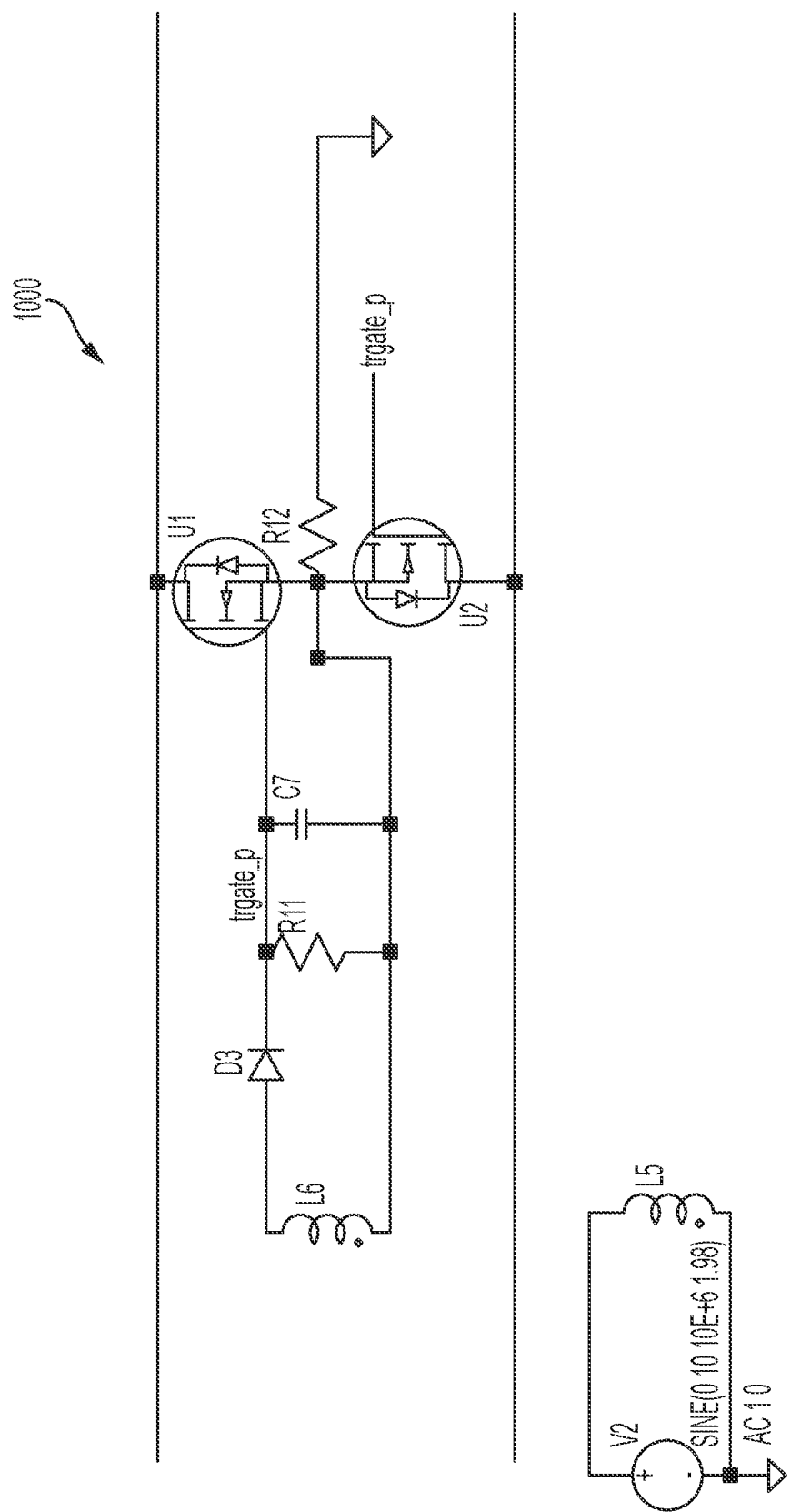
FIG. 12 illustrates circuitry for a GaN FET-based switch for use in an RF signal chain of a magnetic resonance imaging system in accordance with some embodiments.

FIG. 12 illustrates a circuit 1000 for driving a gate voltage on GaN FETs U1 and U2 arranged to operate as an RF transmit/receive switch in accordance with some embodiments. The GaN FETs are configured to couple and decouple the receive electronics from the RF coil. As shown, inductors L5 and L6 are arranged as a transformer configured to couple a control signal V2 to the gates of the FETs U1 and U2, while providing ground isolation. The diode D3 operates to rectify the control signal to create a DC on/off voltage at the gates across capacitor C7. The resistor R11 is configured to discharge capacitor C7 and the gate capacitance of the FETs. The time constant of R11 and C7+Cgates determines how quickly the transmit/receive switch turns off. In some embodiments, control signal V2 may be a 10 MHz sine wave coupled to inductor L5 to drive the FETs. In operation, the 10 MHz signal may be turned on/off to charge up the FET gates and then turned off. Then resistor R11 discharges the gate drive to open the switch. In the example of FIG. 12, the coupling between inductors L5 and L6 may be poor and the inductances small. For example, L5/L6 may be implemented in some embodiments as small air-core transformer or as an RF transformer.

Figure 13:
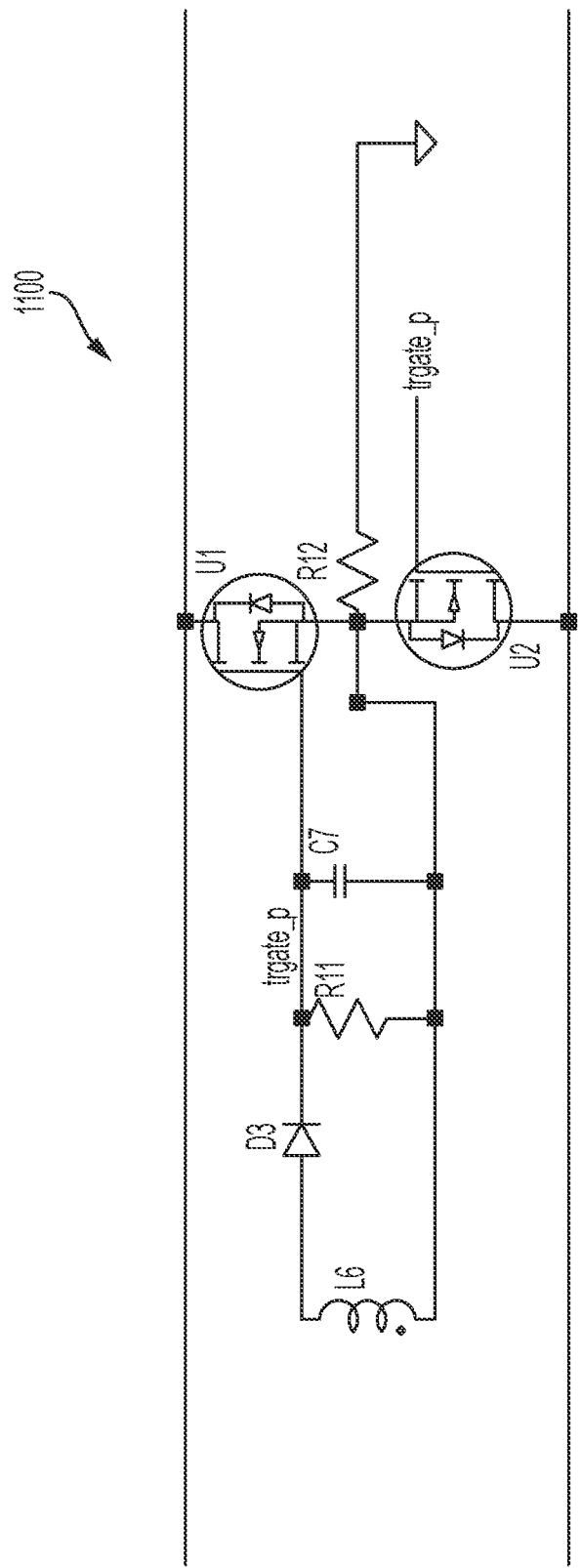
FIG. 13 illustrates circuitry for a GaN FET-based switch for use in an RF signal chain of a magnetic resonance imaging system in accordance with some embodiments.

FIG. 13 illustrates a drive circuit 1100 for driving a gate voltage on GaN FETs U1 and U2 arranged to operate as an RF transmit/receive switch in accordance with some embodiments. In circuit 1100 rather than using an externally provided control signal V2 (as in circuit 1000), the RF transmit pulse itself is used as the control signal to gate the transmit/receive switch. In the example of FIG. 13, a coil represented by inductor L6 is configured to receive the RF transmit pulse, and in response, generate a voltage that drives the gates of the GaN FETs. In some embodiments, each of the RF coils in an RF coil array may be associated with a coil L6 configured to receive the RF transmit pulse for that coil. In other embodiments, a subset (e.g., one) of the RF coils in a multi-coil array may be associated with coil L6 configured to receive the RF transmit pulse, and the switch signal generated by the coil L6 in response to receiving the transmit pulse may be distributed to the circuitry associated with the other RF coils in the array. Circuit 1100 uses less complex drive circuitry than circuit 1000 because a separate control signal generator is not required. However, a consequence of using the transmit pulse as a control signal is that the switch does not close until slightly after RF transmission begins and the RF transmit pulse can be detected by pulse receiver coil L6.

Figure 14A:
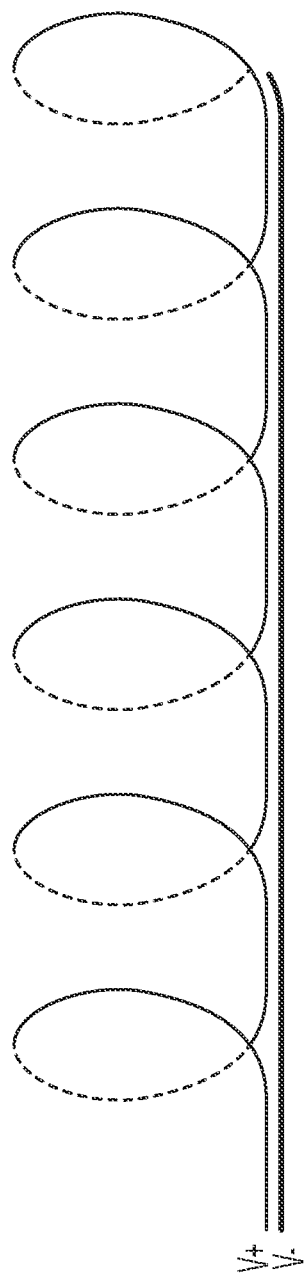
FIG. 14A illustrates a single-pass winding design for an RF coil.

Some embodiments are related to a novel design for a radio-frequency (RF) coil for use in a low-field MRI system. Some conventional RF coil designs for use in MRI systems are configured as a solenoid, which wraps around an object to be imaged in a helix pattern. For example, head coils commonly used in MRI systems include a conductor formed in a solenoid configuration such that a head of a person can be inserted inside of the solenoid. FIG. 14A schematically illustrates a solenoid RF coil design in which a conductor is wound in a plurality of loops around a substrate in a single pass from a first side of the substrate to a second side of the substrate opposite to the first side. When the second side of the substrate is reached, the conductor may be returned to the first side without forming additional loops, as shown.

Figure 14B:
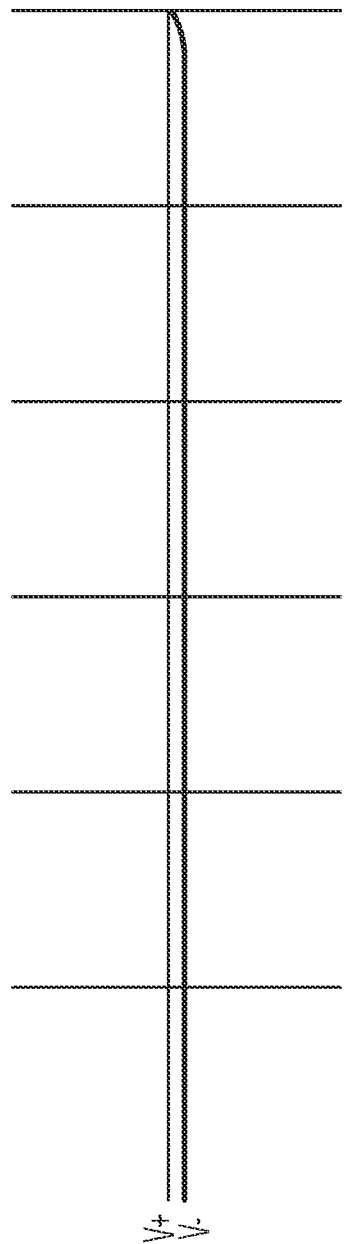
FIG. 14B illustrates a top view of the single-pass winding design of FIG. 14A.

FIG. 14B shows a top view of the coil arrangement of FIG. 14A in which the loops of conductor are represented by vertical lines. Points V+ and V− represent the ends of the conductor in the coil which in an MRI system are connected to an amplifier (e.g., a low noise amplifier) configured to amplify the recorded signals.

In an ideal case, the potential recorded at the outputs of the RF coil are balanced such that V+−V−=0 in the absence of electromotive force (emf) in the coil. However, when an object, such as the head of a person, is inserted into the solenoid coil, parasitic coupling occurs between the object and the conductor in the coil that may result in V+ and V− being unbalanced and producing a voltage at the amplifier input. The voltage is manifested as a noise signal in the recorded MR signal when the coil is used in the MRI system. Depending on the location of the head within the RF coil, the parasitic coupling may affect the signals recorded at the points V+ and V− differently. For example, when the object is inserted at one end of the coil, the magnitude of the noise introduced into the recorded signal due to parasitic coupling may be larger at the point V+ compared to the point V− because of the shorter conductor distance between V+ and the point at which the noise was introduced in the coil. Alternatively, if the object is arranged at or near the center of the coil between points V+ and V−, the noise introduced into the coil would affect the voltage detected at both points V+ and V− equally. In yet another implementation, if the object was arranged closer to point V−, more noise would be detected at the point V− than the point V+ resulting in an unbalanced output (i.e., V+−V−≠0).

Figure 15A:
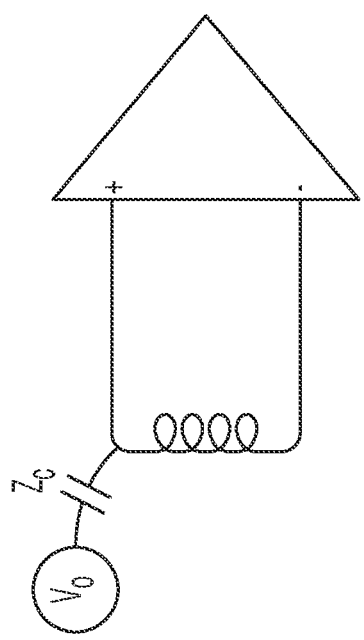
FIG. 15A illustrates a schematic of an RF coil connected to an amplifier for use in a low-field MRI system in accordance with some embodiments.
Figure 15B:
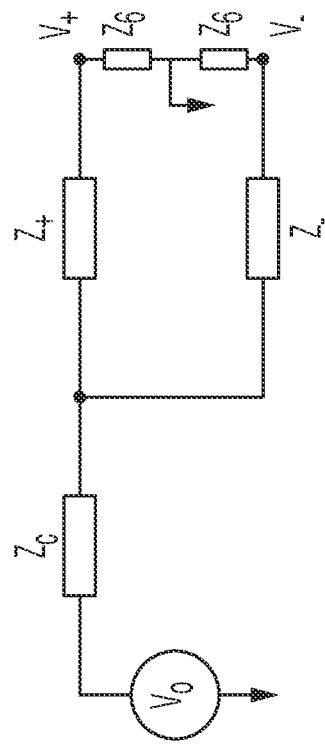
FIG. 15B illustrates an impedance model for representing impedances association with a parasitic coupling of an object to an RF coil in accordance with some embodiments.

FIG. 15A schematically illustrates that when an object (represented as voltage source $V_0$) is inserted into a solenoid coil at a particular location, a parasitic coupling (represented as impedance $Z_C$) is introduced into the coil at a single point in the coil. It should be appreciated that in practice, the parasitic coupling from the object to the coil winding will be distributed. FIG. 15B illustrates an impedance model for how the introduction of the parasitic coupling affects the voltages $V_+$, $V_-$ measured at the ends of the conductor. $Z_C$ represents the parasitic coupling between the object and the coil, $Z_+$ represents the impedance in the conductor between the point at which the parasitic coupling is introduced and the point $V_+$, $Z_-$ represents the impedance in the conductor between the point at which the parasitic coupling is introduced and the point $V_-$, and $Z_G$ represents the impedance between each of the ends of the conductor (i.e., $V_+$ and $V_-$) and ground. When there is a weak parasitic coupling between the object and the coil (e.g., $Z_c \square Z_+$, $Z_-$, $Z_G$), the follow relation describes the difference in potential at the two ends of the conductor $V_+$ and $V_-$:

$$V_+ - V_- = \frac{Z_G}{Z_C^2}(Z_- - Z_+)V_0$$

Because the outputs of the coil at V+ and V− may be unbalanced, some conventional RF coils include a balun between the RF coil and the amplifier to provide a balanced output and to reject common mode noise introduced into the coil. The inventors have recognized that the use of baluns to reject common mode noise introduced into an RF coil is not desirable in a low-field MRI system due to small magnitude signals that are received by the coil and the lossy characteristics of baluns. To this end, some embodiments are directed to an RF coil design that uses a winding pattern designed to reduce common mode noise, which mitigates the need to use a balun.

FIGS. 16-19 schematically illustrate RF coil designs in accordance with some embodiments. For the coil designs shown in FIGS. 16-19, the result is a solenoid coil having similar magnetic properties as the conventional coil winding pattern shown in FIG. 14A. For example, turns of the coil located near each other detect a similar magnetic flux. However, the electrical properties of the RF coil designs shown in FIGS. 16-19 are different than those for the FIG. 14A coil design. In particular, the winding designs shown in FIGS. 16-19 result in improved balance and common mode rejection when an object to be imaged is inserted in the coil. As shown, when an object to be imaged is inserted into the coil, parasitic coupling between the object and the conductor results in a voltage being induced in the turns of the conductor located near the object. For the winding patterns shown in FIGS. 16-19, adjacent turns of the conductor have a similar inductance and potential when a voltage is applied to the conductor because the adjacent turns are located a similar distance from the respective points V+ and V−. Accordingly, the voltage induced in the conductor due to parasitic coupling of an object inserted in the coil to the conductor manifests as a noise signal similarly at both outputs V+ and V− regardless of the location of the object in the coil, such that V+−V−~0, thereby reducing the common mode noise.

Figure 16A:
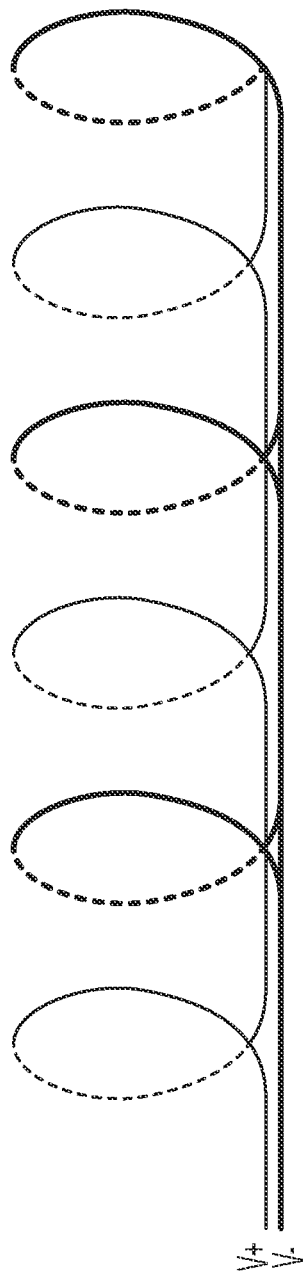
FIG. 16A illustrates an interlaced winding design for an RF coil in accordance with some embodiments.
Figure 16B:
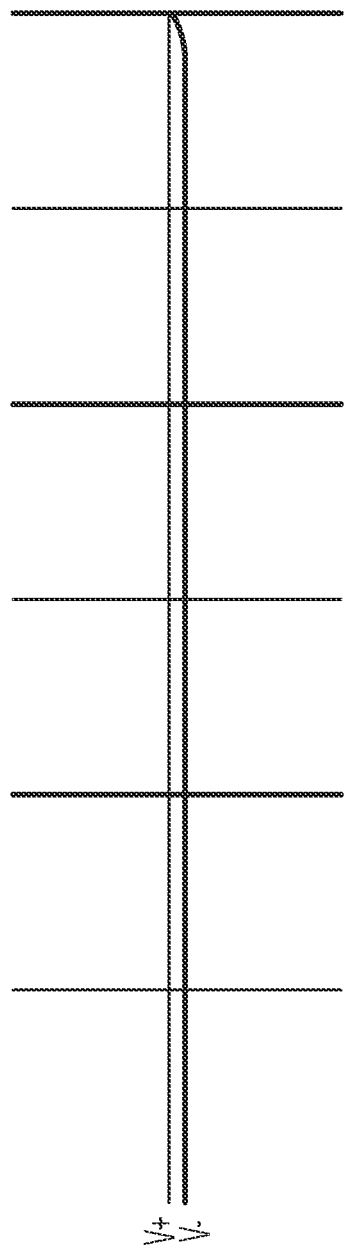
FIG. 16B illustrates a top view of the interlaced winding design of FIG. 16A.

Rather than winding the conductor in a single pass of loops from one end of the RF to the other end as shown in FIG. 14A, the conductor is wound in some embodiments in a balanced pattern using multiple (e.g., two) passes of loops or partial loops from end-to-end. FIG. 16A shows an "interlaced" winding pattern in which a conductor starting at one end of a substrate is wound around the substrate by skipping portions of the substrate at different levels spaced from a first end of the conductor along the winding direction in a first pass. When the conductor is wound from the other (second) end of the substrate in a second pass, the conductor is wound around those portions of the substrate that were skipped in the first pass. FIG. 16B shows a top view of the interlaced winding pattern illustrated in FIG. 16A.

Figure 17A:
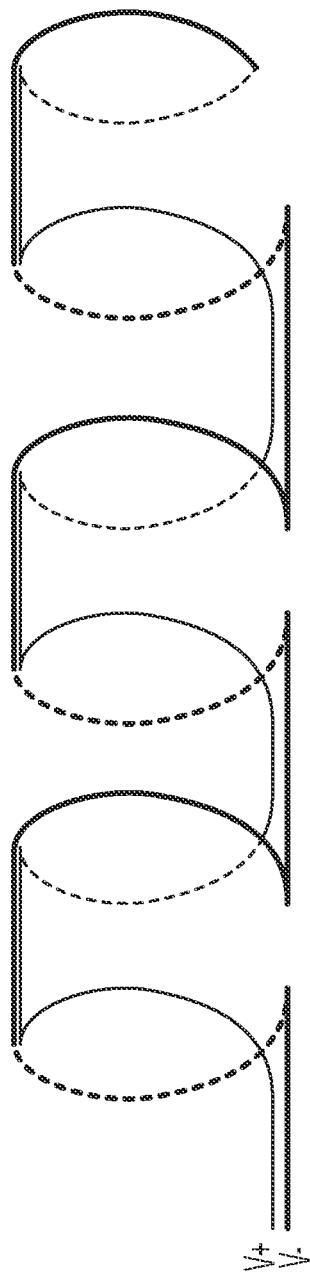
FIG. 17A illustrates an alternate interlaced winding design for an RF coil in accordance with some embodiments.
Figure 17B:
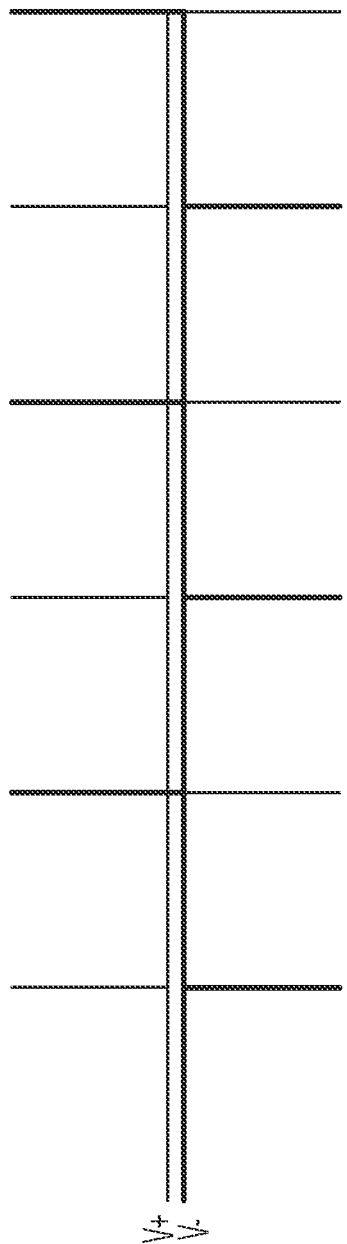
FIG. 17B illustrates a top view of the interlaced winding design of FIG. 17A.

The interlaced winding pattern shown in FIG. 16A skips complete turns (e.g., 360° revolutions) in a first pass and fills in those skipped turns in the second pass in the opposite direction. However, it should be appreciated that alternate interlaced winding patterns are also contemplated. For example, FIG. 17A shows an interlaced pattern where rather than skipping a complete turn (e.g., 360°) in the first pass, the winding pattern completes a series of half turns (e.g., 180°) around the substrate at each of a plurality of levels from the first end of the substrate while skipping the other half of the turns in the first pass. The skipped half turns are then filled in during the second pass from the second end to the first end of the substrate resulting in a full solenoid coil configuration. FIG. 17B shows a top view of the half turn skipping interlaced winding design of FIG. 17A. FIGS. 22A-L described in more detail below illustrate a process for implementing the half turn skipping design illustrated in FIG. 17A.

FIG. 18A illustrates an example of an alternate balanced winding pattern in accordance with some embodiments. In the winding pattern shown in FIG. 18A, a first plurality of loops of conductor are wound around the substrate from the first end to the second end without skipping any levels on the first pass. On the second pass from the second end to the first end, a second plurality of loops located near the first plurality of loops are wound around the substrate to create a "double" winding pattern. FIG. 18B shows a top view of the winding pattern illustrated in FIG. 18A.

Figure 19:
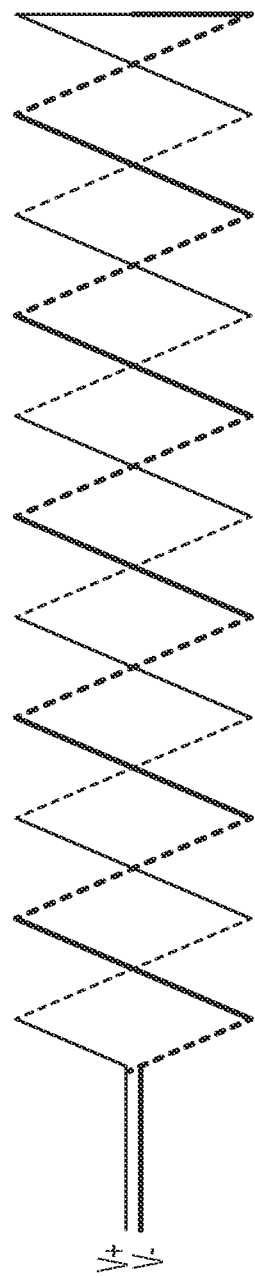
FIG. 19 illustrates a top view of a reverse helix winding design for an RF coil in accordance with some embodiments.

FIG. 19 shows a top view of another balanced winding pattern with an interlaced configuration in accordance with some embodiments. In the winding pattern shown in FIG. 19, rather than forming loops in a series of levels from a first end of the substrate to a second end of the substrate (e.g., as shown in FIG. 16A), the conductor is wound in a first pass from the first end to the second end of the substrate in a helix configuration, and in a second pass from the second end to the first end of the substrate in a reverse helix configuration. The particular angle to form the helix winding configuration is not a limitation of embodiments of the invention, as any suitable angle with any desired number of turns around the substrate may be used.

Figure 20:
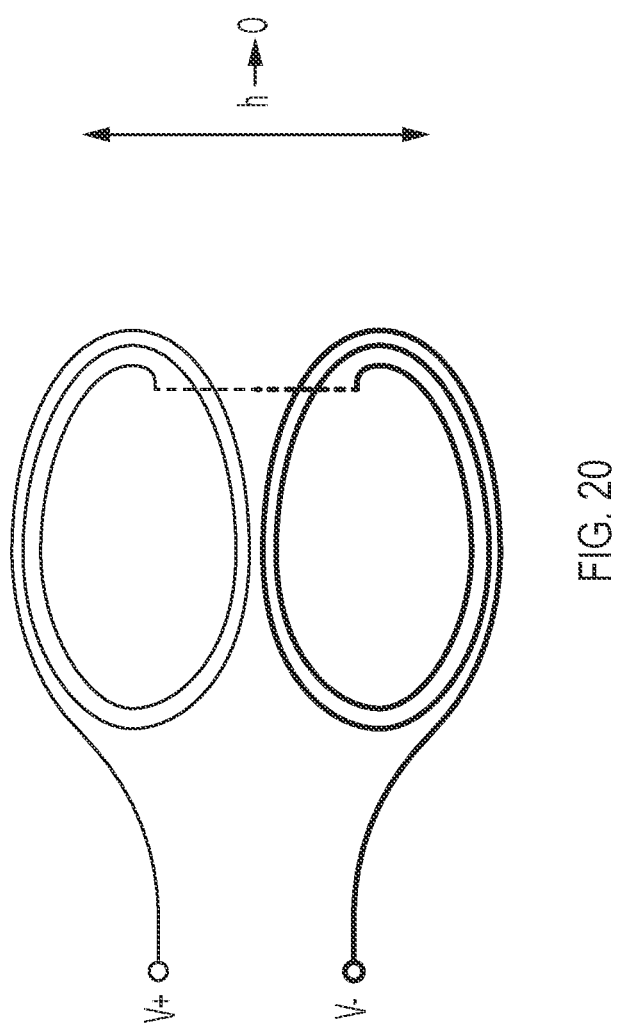
FIG. 20 illustrates a balanced winding design for an RF surface coil in accordance with some embodiments.

The balanced winding patterns described above in connection with FIGS. 16-19 relate to RF coils having a solenoid configuration in which an object (e.g., a patient's head is inserted within the solenoid. The inventors have recognized that the balanced winding techniques described herein may also be used for coil configurations other than a solenoid coil. For example, FIG. 20 illustrates an example of using a balanced winding pattern to create an RF surface coil. The surface coil includes two conductor windings arranged in close proximity to each other. As shown, the distance (h) between the two windings may be made small (e.g., approaching a distance close to 0) such that the multiple windings have magnetic properties similar to a coil that has a single winding. In some embodiments, the two windings may be configured to be 180° out of phase with each other.

Figure 21:
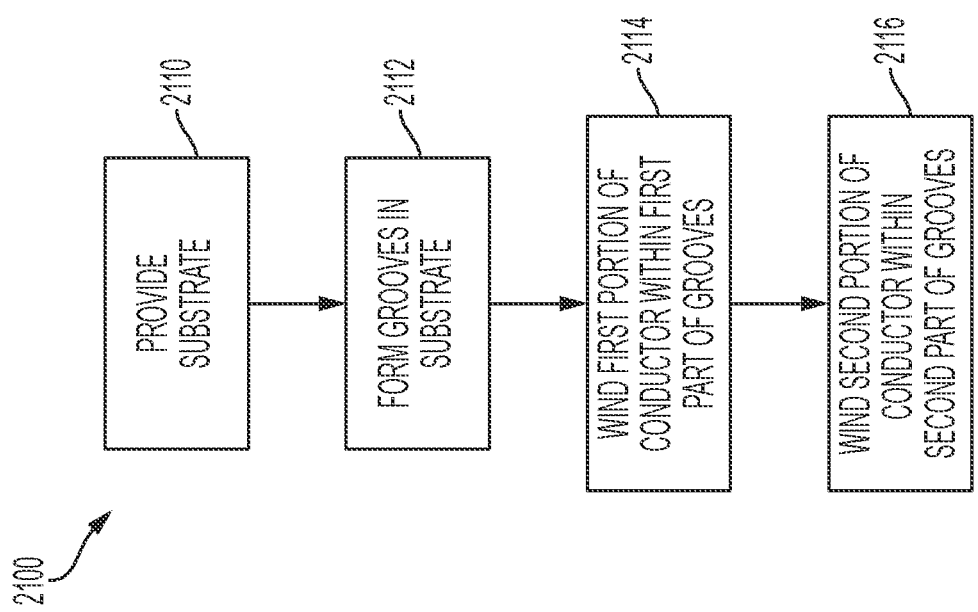
FIG. 21 illustrates a process for creating an RF coil with a balanced winding pattern in accordance with some embodiments.

FIG. 21 illustrates a process 2100 for manufacturing an RF coil in accordance with some embodiments. In act 2110, a substrate is provided around which a conductor is to be wound. The substrate may be made of any suitable non-magnetic material. In some embodiments the substrate comprises a plastic material fabricated, for example, using an additive manufacturing process (e.g., 3D printing). Process 2130 then proceeds to act 2112, where a plurality of grooves are formed in the substrate. For example, the substrate may include a top and a bottom and the plurality of grooves may be formed at locations space from the top of the substrate to the bottom of the substrate. In some embodiments, the substrate is formed in the shape of a helmet within which the head of a person can be placed, and the grooves are formed as a plurality of circumferential grooves or "rings" around a circumference of the helmet from the top to the bottom. In some embodiments, the plurality of rings are separated using a same spacing from the top to the bottom of the substrate to create a plurality of levels within which a conductor may be wound. The plurality of grooves may also include a plurality of connecting grooves connecting the circumferential grooves. In some embodiments, the grooves may be formed in the substrate as part of fabricating the substrate (e.g., using an additive manufacturing process) such that a separate act of forming grooves in the substrate is not required.

Process 2100 then proceeds to act 2114, where a first portion of a conductor is wound within a first part of the grooves formed in the substrate. As discussed above in connection with FIG. 17A, in some embodiments, a first portion of the conductor may be wound from the top to the bottom of the substrate in grooves located at alternating levels by skipping every other level. In other embodiments, a first portion of the conductor may be wound within part (e.g., half turns) of the grooves on each level while skipping other parts of the grooves on each level. Process 2100 then proceeds to act 2116, where a second portion of the conductor is would within a second part of the grooves formed in the substrate. For example, the second portion of the substrate when wound from the bottom to the top of the substrate may be wound using the parts of the grooves that were skipped when the first part of the conductor was wound from the top to the bottom. When winding the second part of the conductor from the bottom to the top portions of the second part of the conductor may cross over (or under) portions of the first part of the conductor wound from the top to the bottom. Any suitable conductor including, but not limited to, copper wire and litz wire may be used. The conductor may be single stranded or may include multiple strands of conductive material. The ends of the conductor may be configured to be coupled to an amplifier to amplify signals recorded by the RF coil when used in a low-field MRI system for receiving MR signals from an imaged object.

Figure 22B:
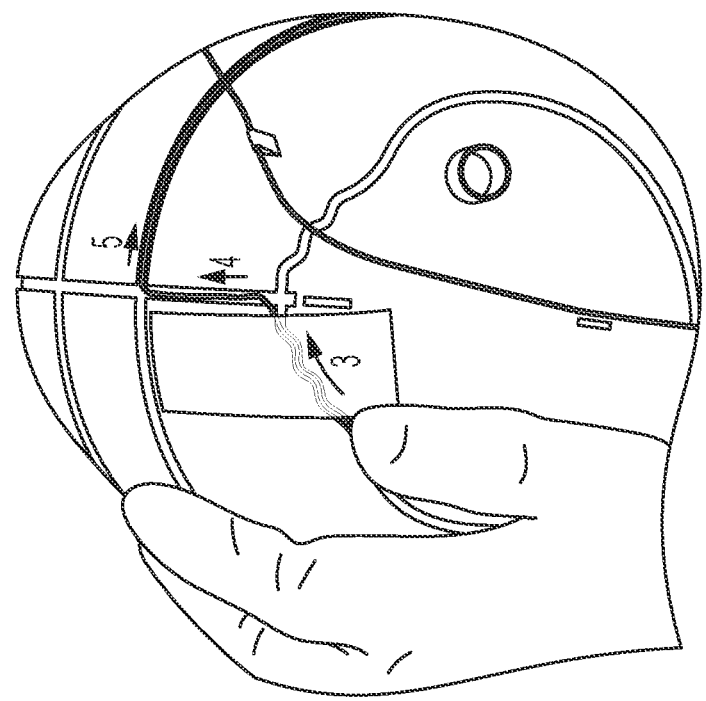
FIGS. 22A-22L illustrate acts in a process for creating an RF coil with an interlaced winding pattern in accordance with some embodiments.
Figure 22A:
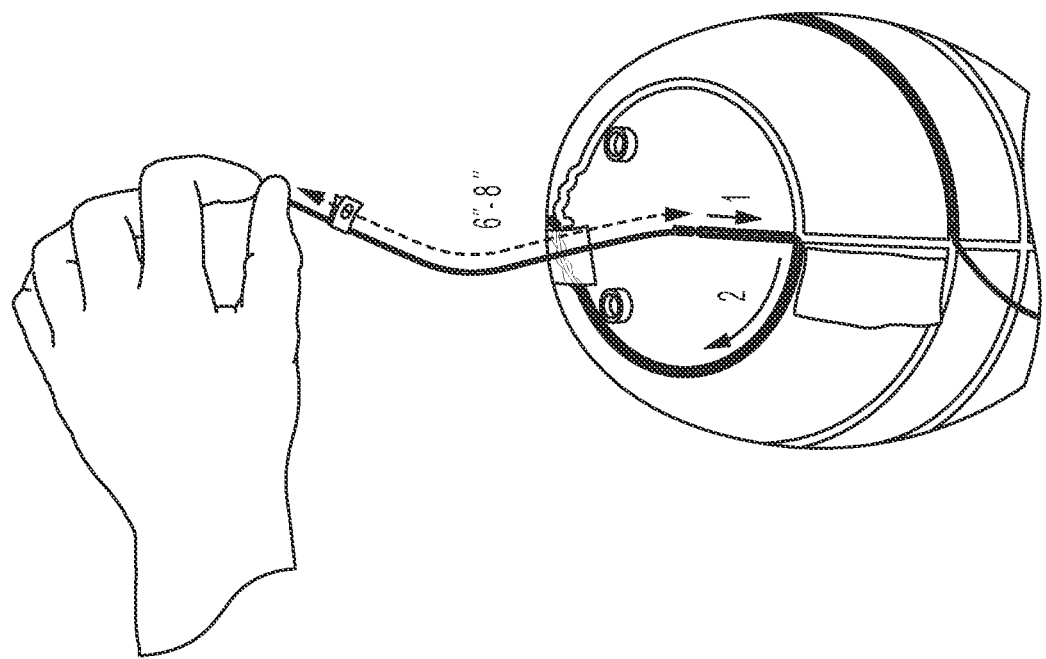
Figure 22D:
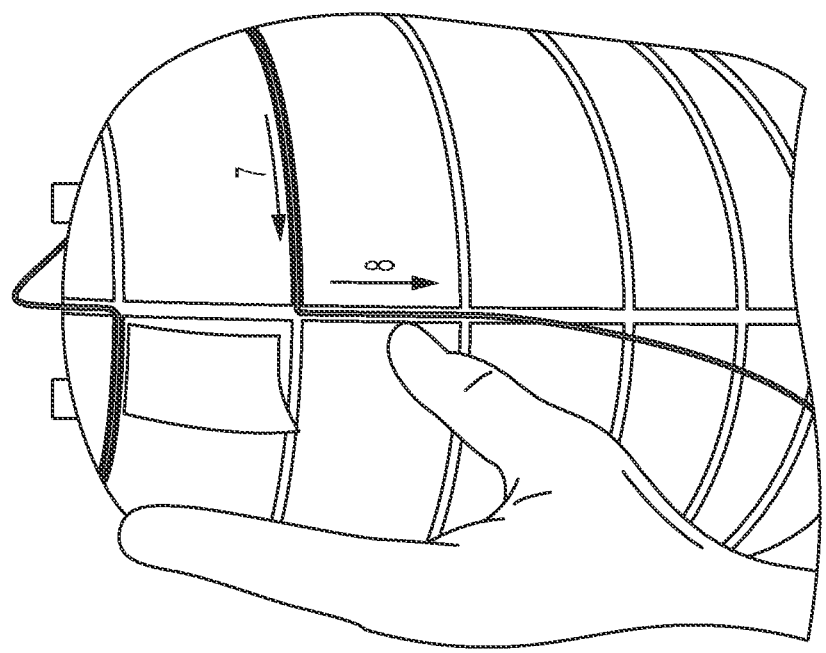
Figure 22C:
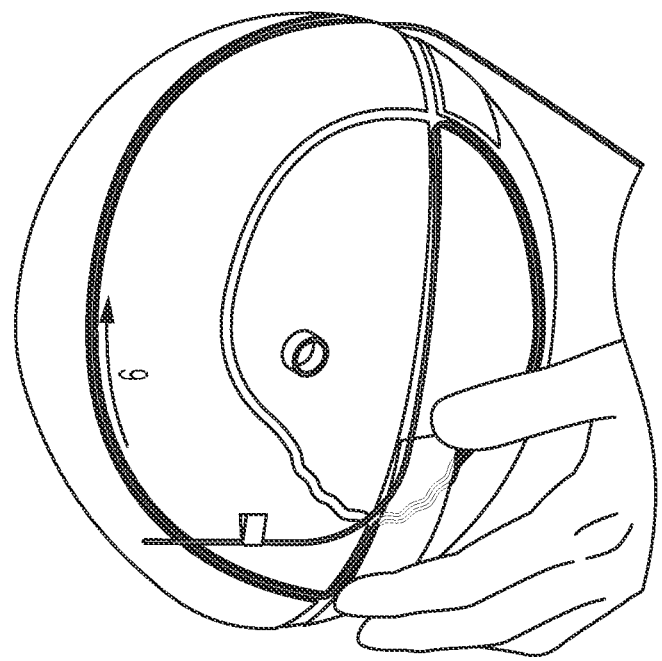
Figure 22F:
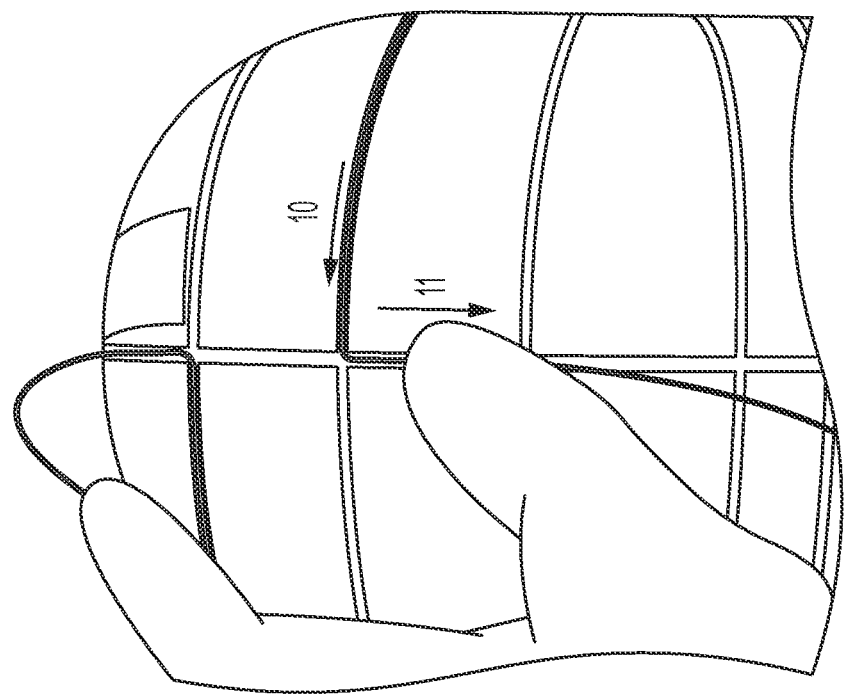
Figure 22E:
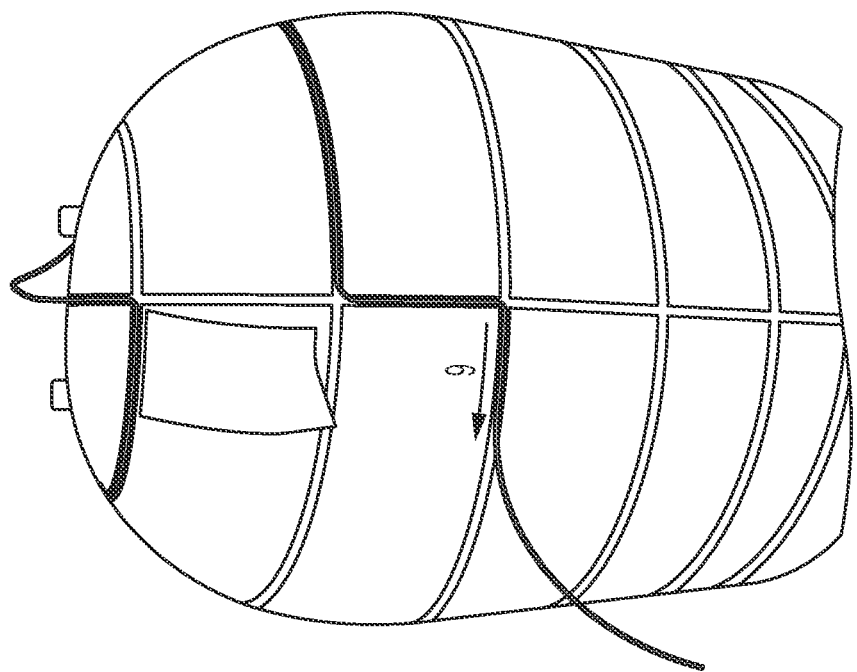
Figure 22H:
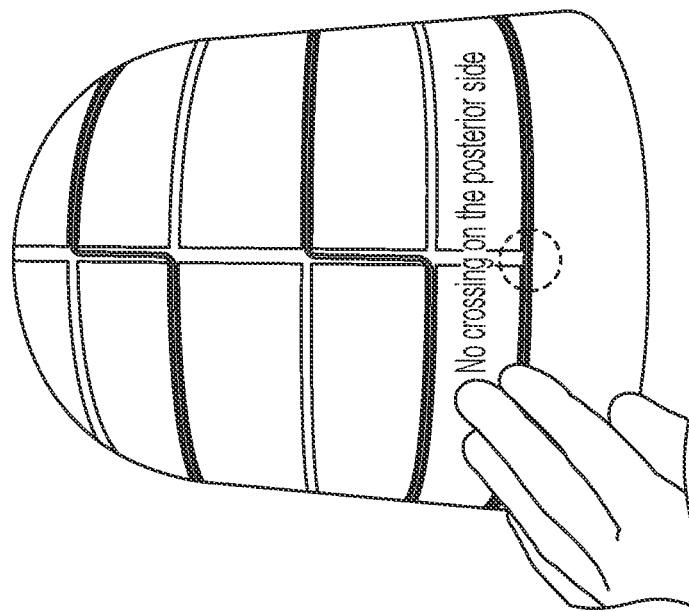
Figure 22G:
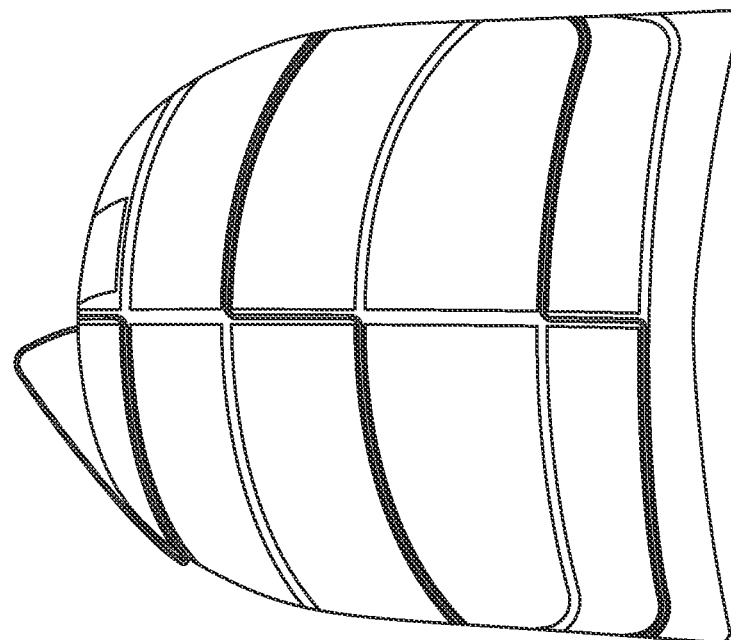

FIGS. 22A-22L illustrate acts in a process of manufacturing a transmit/receive RF head coil for use in a low-field MRI system in accordance with some embodiments. FIG. 22A shows that the coil winding starts from the top of a substrate (e.g., a plastic helmet having grooves formed therein) in accordance with the numbered arrows. For example, the conductor is arranged (1) in a connecting groove connecting the top of the substrate to a first circumferential groove. The conductor is then wound (2) in a clockwise direction around a half turn of the first circumferential groove. FIG. 22B shows that after completion (3) of the half turn of the first circumferential groove, the conductor is arranged (4) in a connecting groove connecting the first circumferential groove and a second circumferential groove spaced further from the top than the first circumferential groove. The conductor is then wound (5) around an opposite half turn of the second circumferential groove also in the clockwise direction. FIG. 22C shows the conductor is wound (6) within the second circumferential groove until (7) a connecting groove connecting the second and third circumferential grooves is reached as shown in FIG. 22D. The conductor is then arranged (8) within the connecting groove between the second and third circumferential grooves. FIG. 22E shows that winding (9) continues in the third circumferential groove in the clockwise direction around an opposite half turn until (10) a connecting groove connecting the third and fourth circumferential grooves is reached as shown in FIG. 22F. The conductor is then arranged (11) within the connecting groove between the third and fourth circumferential grooves. FIG. 22G shows that winding continues in the half turn pattern described above until the bottommost circumferential groove is reached. In some embodiments, there is no crossing of the conductor on a posterior side of the helmet as shown in FIG. 22H.

Figure 22J:
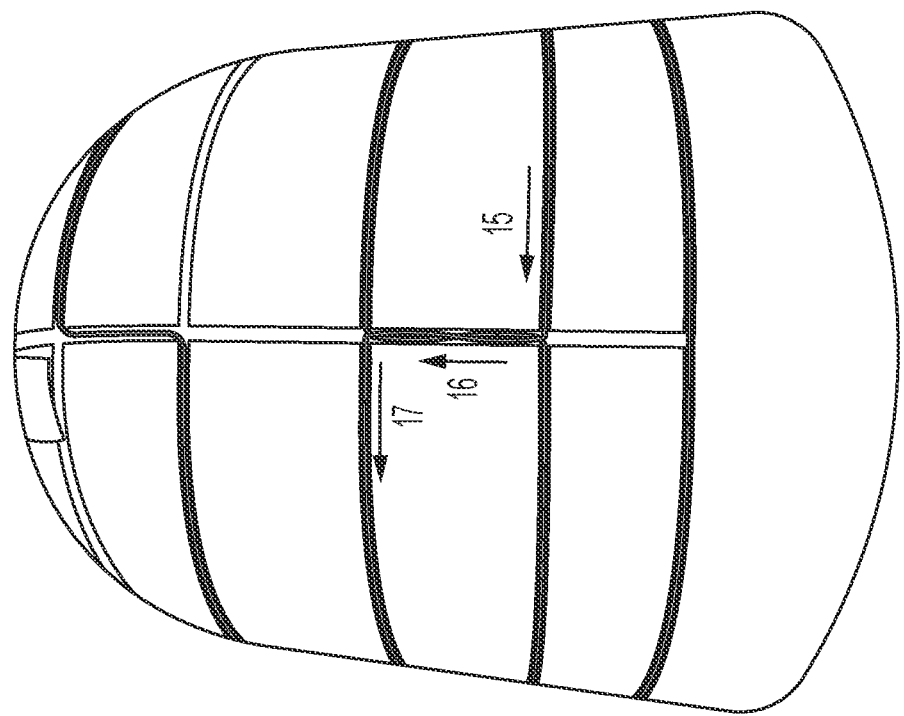
Figure 22I:
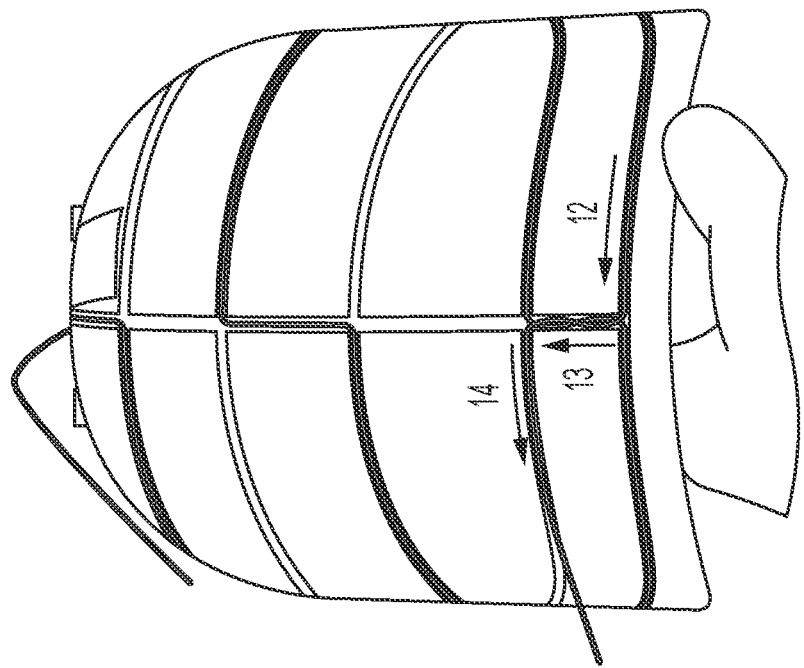
Figure 22L:
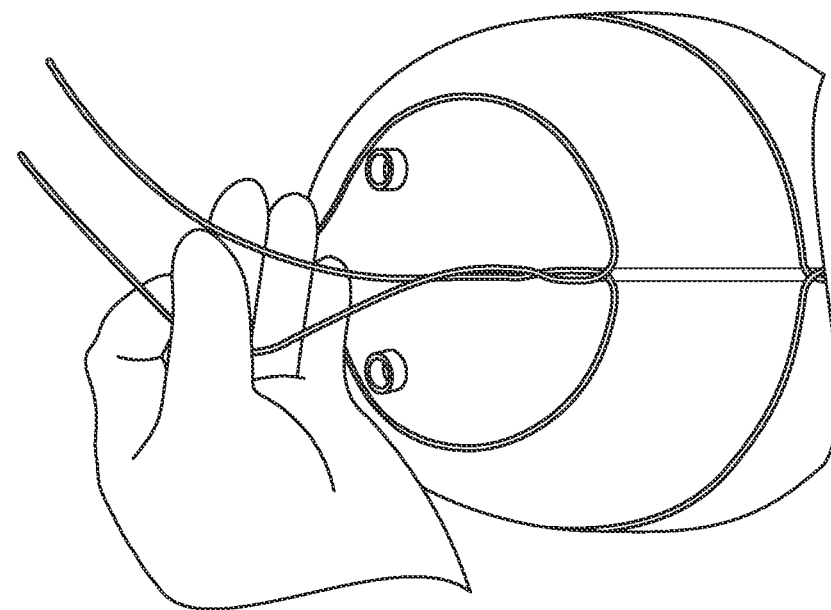
Figure 22K:
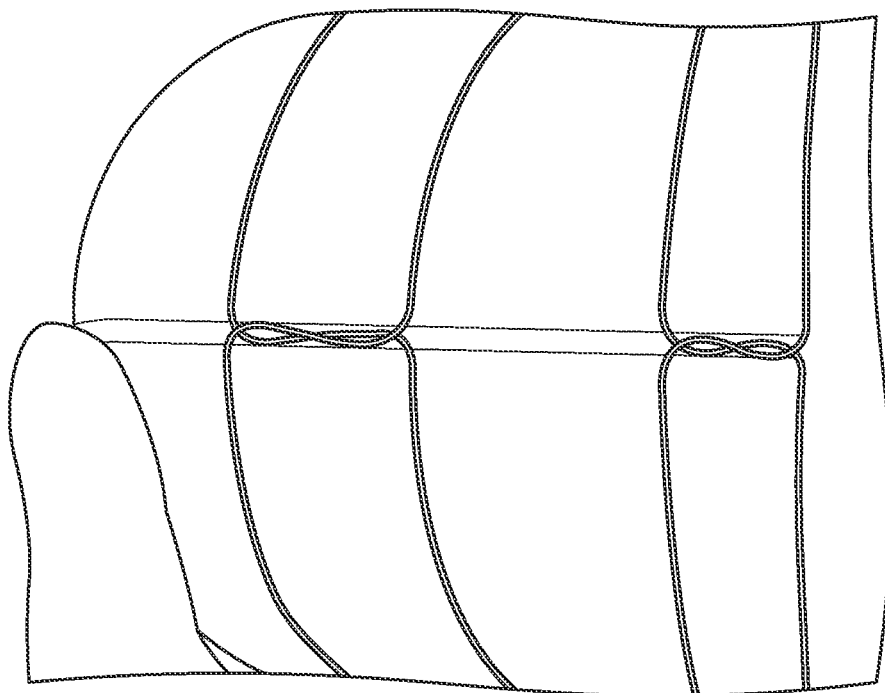

FIG. 22I shows that after completion of the winding on the bottommost circumferential groove, winding of the conductor continues from bottom to top within the parts of the circumferential grooves that were skipped in the winding from top to bottom. For example, the conductor is wound (12) in the bottommost circumferential groove, the conductor is arranged (13) and crosses over part of the conductor within the connecting groove connecting the bottommost circumferential groove and the circumferential groove above it. Winding (14) continues in that circumferential groove in the portion that was skipped in the top to bottom winding. As shown in FIG. 22J, the winding (15) continues until the next connecting groove is encountered, the conductor is arranged (16) and crosses over the conductor within that connecting groove, then continues (17) in the next highest circumferential groove. FIG. 22K shows that the winding continues in the same pattern to the top of the substrate after which the conductor is cut to finish the coil winding for the transmit/receive RF coil with interlaced winding, as shown in FIG. 22L. Although the winding has been described as being in the clockwise direction, it should be appreciated that the winding may alternatively proceed in the counter-clockwise direction. Additionally, although the process described in FIGS. 22A-L show winding half turns in each of the plurality of circumferential grooves, it should be appreciated that a winding pattern where every other circumferential groove is skipped from top to bottom and is then filled from bottom to top may also be used.

Figure 23B:
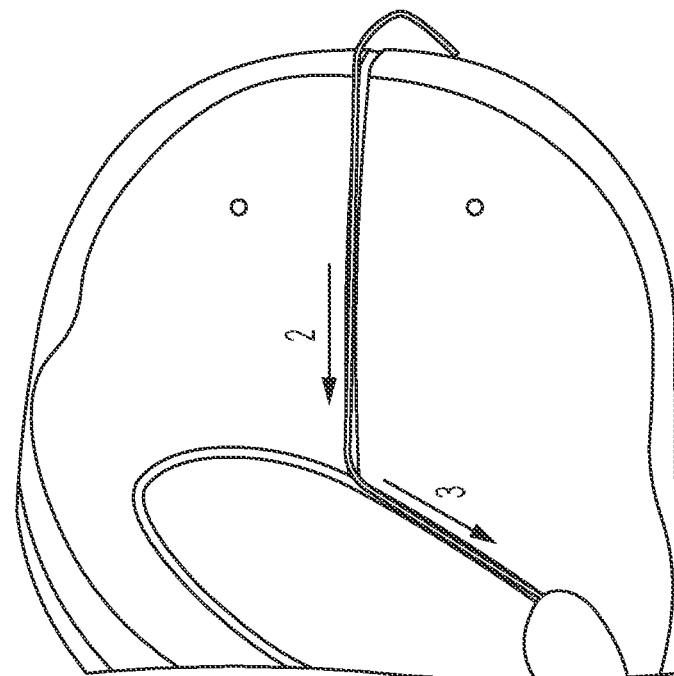
FIGS. 23A-23H illustrate acts in a process for creating an RF coil with an alternate interlaced winding pattern in accordance with some embodiments.
Figure 23A:
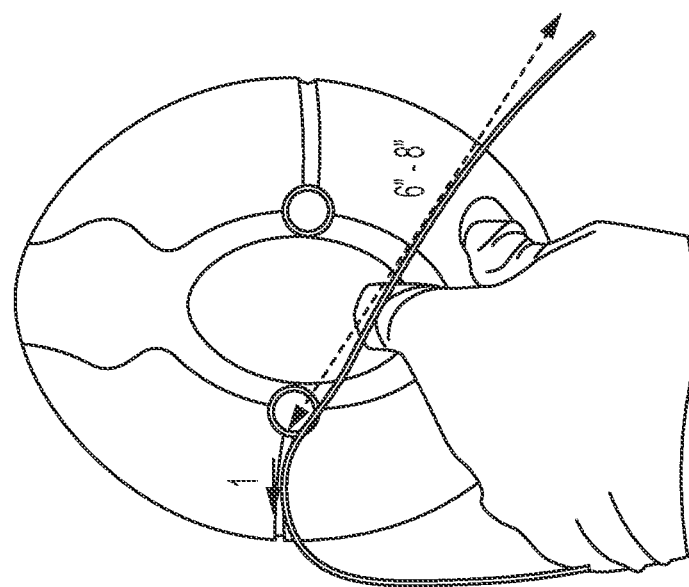
Figure 23D:
Figure 23C:
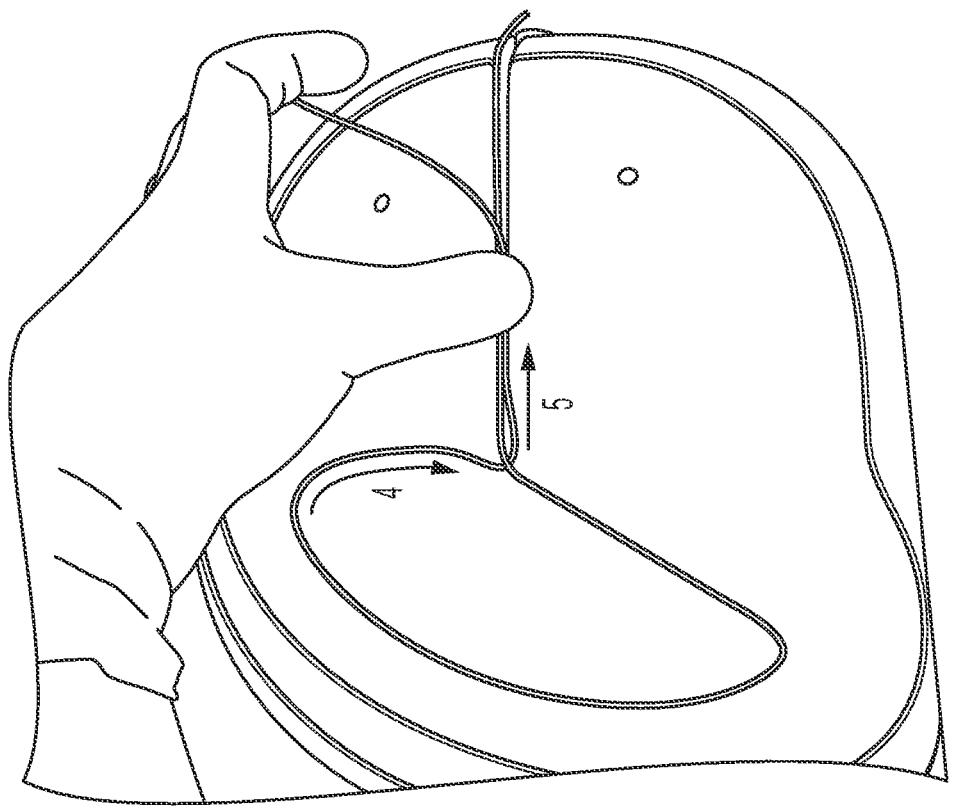
Figure 23F:
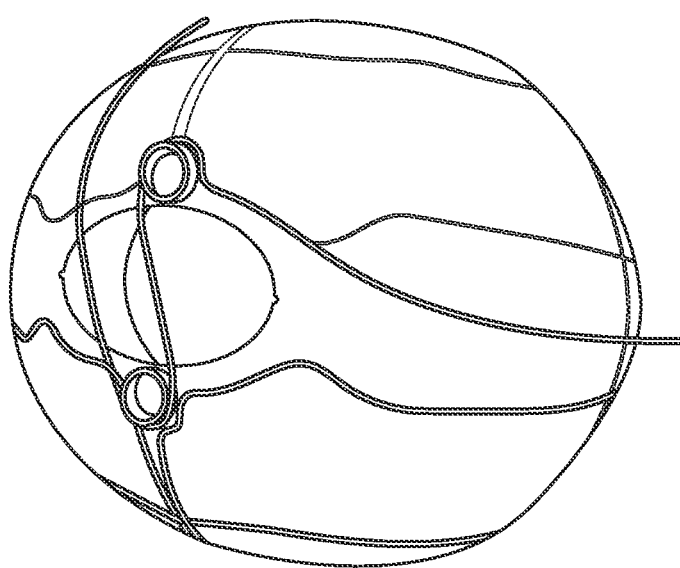
Figure 23E:
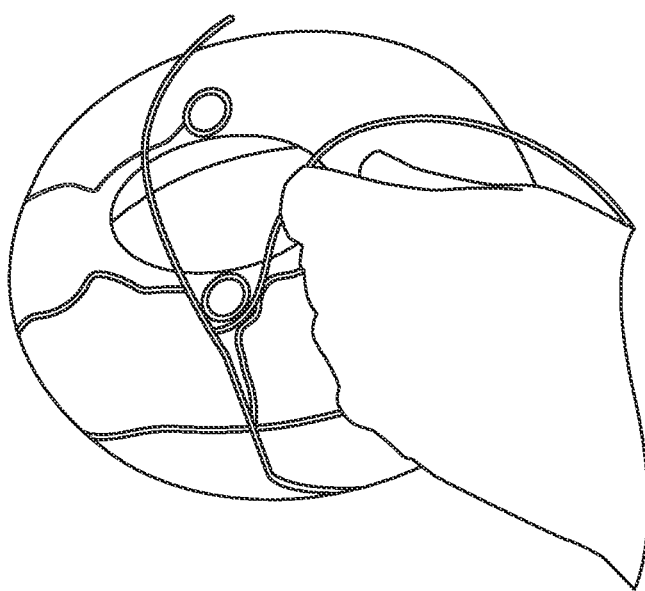
Figure 23H:
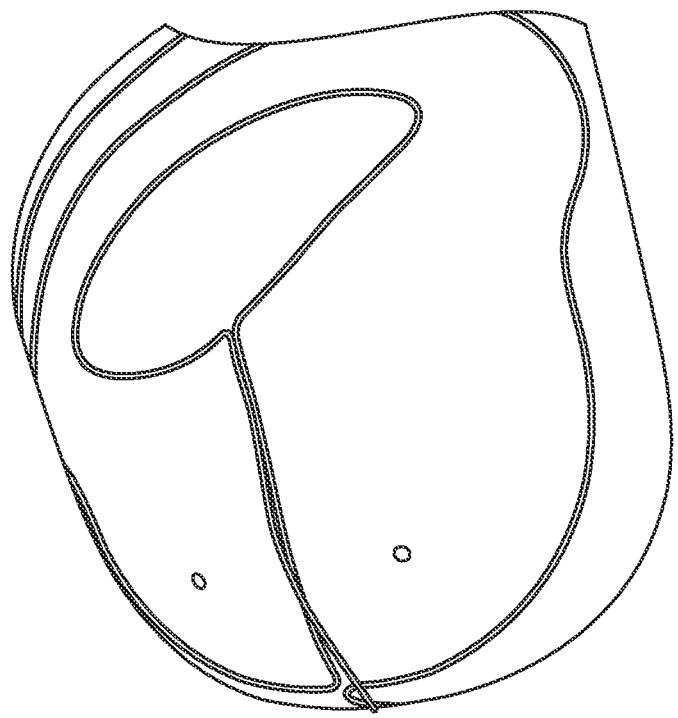
Figure 23G:
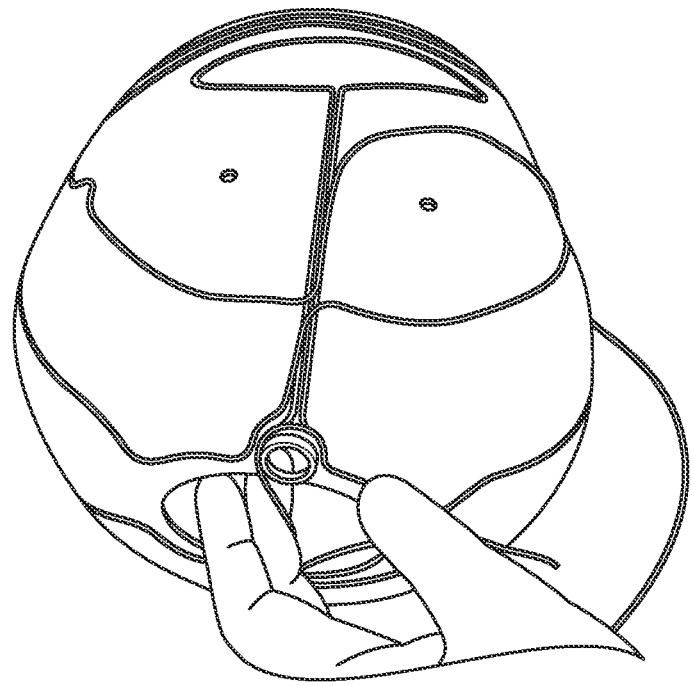

FIG. 23A shows a process for manufacturing a receive-only RF coil using an interlaced winding pattern in accordance with some embodiments. As shown, the coil winding starts by arranging (1) the conductor from the top of the substrate (e.g., a plastic helmet having grooves formed therein) in a connecting groove to one side (e.g., the left side) of the substrate. FIG. 23B shows that when the conductor reaches (2) a ring groove on the left side, the conductor is wound (3) around the ring groove. FIG. 23C shows that when winding (4) of the conductor around the ring groove is completed, the conductor is arranged (5) and crosses over the conductor in the connecting groove connecting the ring groove and the top of the substrate. As shown in FIG. 23D, winding (6) continues in a curved groove formed in the left half of the helmet. FIG. 23E shows that after winding in the left half of the helmet is completed, the conductor is arranged to cross over the top of the helmet to begin winding of the conductor on the right half of the helmet as shown in FIG. 23F. FIGS. 23G and 23H show that the winding in the right half of the helmet continues around the grooves in the right half of the helmet and is arranged and crosses over the conductor in the connecting groove connecting the ring groove on the right half of the helmet and the top of the helmet.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-discussed function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A radio-frequency (RF) coil for use in a low-field magnetic resonance imaging system, the RF coil comprising:
a conductor arranged on a substrate in an arrangement such that symmetry in the arrangement cancels at least a portion of a common mode voltage when a current is passed through the conductor.

2. The RF coil of claim 1, further comprising the substrate, wherein:
the substrate comprises a first side and a second side;
the substrate comprises grooves formed in first and second sides of the substrate; and
the conductor is disposed in the grooves formed in the first and second sides of the substrate, the conductor having a first portion wound around the substrate from the first side to the second side at a first plurality of locations spaced between the first side and the second side and a second portion wound around the substrate from the second side to the first side at a second plurality of locations spaced between the first side and the second side.

3. The RF coil of claim 2, wherein the first plurality of locations alternate with the second plurality of locations spaced between the first side and the second side.

4. The RF coil of claim 3, wherein the first portion comprises a first series of full turns wound around a circumference of the substrate from the first side to the second side and the second portion comprises a second series of full turns wound around the circumference of the substrate from the second side to the first side.

5. The RF coil of claim 3, wherein the first portion comprises first partial turns wound around a circumference of the substrate from the first side to the second side, and the second portion comprises second partial turns wound around the circumference of the substrate from the second side to the first side.

6. The RF coil of claim 5, wherein the first partial turns and the second partial turns are 180 degree turns.

7. The RF coil of claim 3, wherein the first plurality of locations and the second plurality of locations are spaced from the first side of the substrate using a same spacing.

8. The RF coil of claim 2, wherein:
the first portion of the conductor crosses over the second portion of the conductor; and
the arrangement comprises a balanced winding pattern.

9. A method of manufacturing a radio-frequency (RF) coil for use in a low-field magnetic resonance imaging system, the method comprising:
providing a substrate having grooves formed therein; and
arranging a conductor in the grooves formed in the substrate in an arrangement such that symmetry in the arrangement cancels at least a portion of a common mode voltage when a current is passed through the conductor.

10. The method of claim 9, wherein:
the substrate comprises a first side and a second side, the grooves being formed in the first side and the second side of the substrate; and
arranging the conductor in the grooves formed in the substrate in the arrangement comprises:
winding a first portion of the conductor around the substrate from the first side to the second side at a first plurality of locations spaced between the first side and the second side; and
winding a second portion of the conductor around the substrate from the second side to the first side at a second plurality of locations spaced between the first side and the second side.

11. The method of claim 10, wherein the first plurality of locations alternate with the second plurality of locations spaced between the first side and the second side.

12. The method of claim 10, wherein:
winding the first portion of the conductor around the substrate comprises winding the first portion of the conductor around the substrate in a first series of full turns wound around a circumference of the substrate from the first side to the second side; and
winding the second portion of the conductor around the substrate comprises winding the second portion of the conductor around the substrate in a second series of full turns wound around the circumference of the substrate from the second side to the first side.

13. The method of claim 10, wherein:
winding the first portion of the conductor around the substrate comprises winding the first portion of the conductor around the substrate in first partial turns wound around a circumference of the substrate from the first side to the second side, and
winding the second portion of the conductor around the substrate comprises winding the second portion of the conductor around the substrate in second partial turns wound around the circumference of the substrate from the second side to the first side.

14. The method of claim 13, wherein the first partial turns and the second partial turns are 180 degree turns.

15. The method of claim 10, wherein the first plurality of locations and the second plurality of locations are spaced from the first side of the substrate using a same spacing.

16. The method of claim 10, wherein:
the first portion of the conductor crosses over the second portion of the conductor; and
the arrangement comprises a balanced winding pattern.

17. A magnetic resonance imaging (MRI) system for imaging a patient, the MRI system comprising:

at least one $B_0$ magnet for generating a $B_0$ magnetic field; and a radio-frequency (RF) coil comprising a conductor arranged on a substrate in an arrangement such that symmetry in the arrangement cancels at least a portion of a common mode voltage when current is passed through the conductor.

18. The MRI system of claim 17, wherein:

the RF coil further comprises the substrate, the substrate having a first side and a second side;

the substrate comprises grooves formed in first and second sides of the substrate; and the conductor is disposed in the grooves formed in the first and second sides of the substrate, the conductor having a first portion wound around the substrate from the first side to the second side at a first plurality of locations spaced between the first side and the second side and a second portion wound around the substrate from the second side to the first side at a second plurality of locations spaced between the first side and the second side.

19. The MRI system of claim 18, wherein the first plurality of locations alternate with the second plurality of locations spaced between the first side and the second side.

20. The MRI system of claim 18, wherein:

the first portion of the conductor crosses over the second portion of the conductor; and the arrangement comprises a balanced winding pattern.

* * * * *